United States Patent
Yamada

(10) Patent No.: US 7,234,096 B2
(45) Date of Patent: Jun. 19, 2007

(54) DECODING METHOD AND RECORDING-MEDIUM REPRODUCING APPARATUS

(75) Inventor: Eiji Yamada, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 628 days.

(21) Appl. No.: 10/125,153

(22) Filed: Apr. 18, 2002

(65) Prior Publication Data

US 2002/0174400 A1 Nov. 21, 2002

(30) Foreign Application Priority Data

| Apr. 18, 2001 | (JP) | ............................. 2001-119401 |
| Sep. 19, 2001 | (JP) | ............................. 2001-284959 |
| Sep. 21, 2001 | (JP) | ............................. 2001-289145 |
| Apr. 4, 2002 | (JP) | ............................. 2002-102750 |

(51) Int. Cl.

| G11B 20/14 | (2006.01) |
| H03M 13/23 | (2006.01) |
| H03M 13/29 | (2006.01) |
| H03M 13/45 | (2006.01) |

(52) U.S. Cl. ........................ 714/755; 341/59; 714/769; 714/780; 714/792

(58) Field of Classification Search ................ 714/755, 714/780, 792, 769; 341/59
See application file for complete search history.

(56) References Cited

U.S. PATENT DOCUMENTS

| 4,583,078 A | * | 4/1986 | Shenoy et al. ................. 341/51 |
| 5,095,484 A | * | 3/1992 | Karabed et al. ............. 714/746 |
| 5,291,499 A | * | 3/1994 | Behrens et al. .............. 714/796 |
| 5,398,254 A | * | 3/1995 | Miya et al. .................. 714/795 |
| 5,548,600 A | * | 8/1996 | Fredrickson et al. ........ 714/792 |
| 5,809,080 A | * | 9/1998 | Karabed et al. ............. 375/263 |
| 5,931,966 A | * | 8/1999 | Carley ......................... 714/795 |
| 5,938,788 A | * | 8/1999 | Hayashi ....................... 714/794 |

(Continued)

FOREIGN PATENT DOCUMENTS

EP 1143440 A2 10/2001

(Continued)

OTHER PUBLICATIONS

Oberg, M. et al., "Parity Check Codes for Partial Response Channels", IEEE GLOBECOM 99, Dec. 1999, pp. 717-722.*

(Continued)

*Primary Examiner*—Stephen M. Baker
(74) *Attorney, Agent, or Firm*—David G. Conlin; David A. Tucker; Edwards Angell Palmer & Dodge, LLP

(57) ABSTRACT

At the preceding stage of a first one of two APP decoders that constitute a turbo decoder, there is provided a logarithmic-likelihood computing circuit that creates and outputs logarithmic likelihoods $L(y'_i|y_i)$ of a reproduced signal $y'_i$ which is soft information. The first APP decoder has an APP decoding function of receiving logarithmic likelihoods $L(y'_i|y_i)$ of the reproduced signal $y_i$ as well as a priori information as to code data $c'_i$, updating the code data $c'_i$ and producing outputs of a posteriori probabilities according to trellis diagram information that satisfy constraints concerning an RLL modulation. Turbo decoding becomes compatible with the RLL demodulation, and a turbo decoding with high error-correcting capability is usable in reproducing channel data $a_i$ recorded onto a recording medium, which allows a recording density of the recording medium to be increased.

48 Claims, 21 Drawing Sheets

U.S. PATENT DOCUMENTS

| | | | | |
|---|---|---|---|---|
| 5,970,104 | A * | 10/1999 | Zhong et al. | 375/341 |
| 6,192,084 | B1 * | 2/2001 | Miyauchi et al. | 375/262 |
| 6,259,749 | B1 * | 7/2001 | Andoh | 375/341 |
| 6,289,487 | B1 * | 9/2001 | Hessel et al. | 714/795 |
| 6,378,107 | B1 * | 4/2002 | Yoshinaka | 714/795 |
| 6,393,598 | B1 * | 5/2002 | Tsang et al. | 714/795 |
| 6,438,180 | B1 * | 8/2002 | Kavcic et al. | 375/341 |
| 6,480,984 | B1 * | 11/2002 | Aziz | 714/795 |
| 6,516,437 | B1 * | 2/2003 | Van Stralen et al. | 714/755 |
| 6,532,272 | B1 * | 3/2003 | Ryan et al. | 375/348 |
| 6,553,541 | B1 * | 4/2003 | Nikolic et al. | 714/795 |
| 6,795,947 | B1 * | 9/2004 | Siegel et al. | 714/802 |
| 6,798,593 | B2 * | 9/2004 | Hattori et al. | 360/53 |
| 6,826,722 | B2 * | 11/2004 | Miyauchi et al. | 714/752 |
| 6,970,522 | B1 * | 11/2005 | Morling et al. | 375/341 |
| 6,996,764 | B2 * | 2/2006 | Yamada | 714/755 |
| 2001/0048564 | A1 | 12/2001 | Hattori et al. | 360/39 |
| 2001/0050889 | A1 | 12/2001 | Hattori et al. | 369/59.24 |
| 2001/0052098 | A1 | 12/2001 | Miyauchi et al. | 714/746 |

FOREIGN PATENT DOCUMENTS

| | | |
|---|---|---|
| JP | 2001-266498 | 9/2001 |
| JP | 2001-266499 | 9/2001 |
| JP | 2001-266500 | 9/2001 |
| JP | 2001-266501 | 9/2001 |

OTHER PUBLICATIONS

Souvignier, T., et al., "Turbo Codes for PR4: Parallel Versus Serial Concatenation", IEEE ICC 99, Jun. 1999, pp. 1638-1642.*

Fan, J., et al., "Constrained Coding Techniques for Soft Iterative Decoders", IEEE GLOBECOM 99, Dec. 1999, pp. 723-727.*

Anim-Appiah, et al., "Turbo Codes Cascaded with High-Rate Block Codes for (0, k)-Constrained Channels", IEEE Journal of Selected Areas in Communications, vol. 19, No. 4, Apr. 2001, pp. 677-685.*

Song, et al., "Iterative Decoding for Partial Response (PR), Equalized, Magneto-Optical (MO) Data Storage Channels", IEEE Journal on Selected Areas in Communications, vol. 19, No. 4, Apr. 2001, pp. 774-782.*

Sivisankaran, et al., "Sequential Turbo Decoding for PR-Equalized Magnetic Recording Channels", IEEE Transactions on Magnetics, vol. 36, No. 5, Sep. 2000, pp. 2179-2182.*

McPheters, et al., "Turbo Codes for PR4 and EPR4 Magnetic Recording", 32nd Asilomar Conference on Signals, Systems & Computers, Nov. 1988, pp. 1778-1782.*

Nasri-Kenari, et al., "A Reduced-Complexity Sequence Detector with Soft Outputs for Partial-Response Channels", IEEE Transactions on Communications, vol. 44, No. 12, Dec. 1996, pp. 1616-1619.*

Spinnler, et al., "Design of Hyper States for Reduced-State Sequence Estimation", ICC 95, Jun. 1995, pp. 1-6.*

Breiling, et al., "Optimum Non-Iterative Turbo-Coding", PIMRC '97, Sep. 1997, pp. 714-718.*

Hideki Sawaguchi, et al.; "*Turbo Decoding for High-Rate Concatenated Parity-Check Codes on PRML Channels*"; IEEE Transactions on Magnetics; vol. 36; No. 5; Sep. 2000; pp. 2173-2175.

* cited by examiner

*Fig.3*

| PRECEDING CHANNEL BIT | CURRENT INPUT BITS | SUCCEEDING INPUT BITS | CHANNEL BITS RLL(1,7) |
|---|---|---|---|
| X | 00 | 0X | 001 |
| 0 | 00 | 1X | 000 |
| 1 | 00 | 1X | 010 |
| 0 | 01 | 0X | 001 |
| 0 | 01 | 1X | 000 |
| 1 | 01 | 00 | 010 |
| 1 | 01 | NON-00 | 000 |
| 0 | 10 | 0X | 101 |
| 0 | 10 | 1X | 010 |
| 0 | 11 | 00 | 010 |
| 0 | 11 | NON-00 | 100 |

NON-00 : 01, 10, 11
X : 1 OR 0

Fig.4

| $a_{i-1}$ | $a_i$ | $z_i$ |
|---|---|---|
| 0 | 0 | 0 |
| 0 | 1 | 1 |
| 1 | 0 | 1 |
| 1 | 1 | 0 |

Fig.6A

| CURRENT STATE | INPUT | OUTPUT | FOLLOWING STATE |
|---|---|---|---|
| 0 | 00 | 001 | 3 |
| 0 | 01 | 001 | 7 |
| 0 | 10 | 000 | 8 |
| 0 | 11 | 000 | 10 |
| 1 | 00 | 001 | 3 |
| 1 | 01 | 001 | 7 |
| 1 | 10 | 011 | 9 |
| 1 | 11 | 011 | 11 |
| 2 | 00 | 110 | 1 |
| 2 | 01 | 110 | 5 |
| 2 | 10 | 111 | 9 |
| 2 | 11 | 111 | 11 |
| 3 | 00 | 110 | 1 |
| 3 | 01 | 110 | 5 |
| 3 | 10 | 100 | 8 |
| 3 | 11 | 100 | 10 |
| 4 | 00 | 001 | 3 |
| 4 | 01 | 001 | 7 |
| 4 | 10 | 000 | 8 |
| 4 | 11 | 000 | 10 |
| 5 | 00 | 011 | 2 |
| 5 | 01 | 000 | 4 |
| 5 | 10 | 000 | 8 |
| 5 | 11 | 000 | 10 |

Fig.6B

| CURRENT STATE | INPUT | OUTPUT | FOLLOWING STATE |
|---|---|---|---|
| 6 | 00 | 110 | 1 |
| 6 | 01 | 110 | 5 |
| 6 | 10 | 111 | 9 |
| 6 | 11 | 111 | 11 |
| 7 | 00 | 100 | 0 |
| 7 | 01 | 111 | 6 |
| 7 | 10 | 111 | 9 |
| 7 | 11 | 111 | 11 |
| 8 | 00 | 110 | 1 |
| 8 | 01 | 110 | 5 |
| 8 | 10 | 011 | 9 |
| 8 | 11 | 011 | 11 |
| 9 | 00 | 001 | 3 |
| 9 | 01 | 001 | 7 |
| 9 | 10 | 100 | 8 |
| 9 | 11 | 100 | 10 |
| 10 | 00 | 011 | 2 |
| 10 | 01 | 111 | 6 |
| 10 | 10 | 111 | 9 |
| 10 | 11 | 111 | 11 |
| 11 | 00 | 100 | 0 |
| 11 | 01 | 000 | 4 |
| 11 | 10 | 000 | 8 |
| 11 | 11 | 000 | 10 |

Fig.7A

| CURRENT STATE | INPUT | OUTPUT | FOLLOWING STATE |
|---|---|---|---|
| 0 | 00 | 001 | 3 |
| 0 | 01 | 001 | 7 |
| 0 | 10 | 000 | 8 |
| 0 | 11 | 000 | 10 |
| 1 | 00 | 101 | 3 |
| 1 | 01 | 101 | 7 |
| 1 | 10 | 113 | 9 |
| 1 | 11 | 113 | 11 |
| 2 | 00 | 443 | 1 |
| 2 | 01 | 443 | 5 |
| 2 | 10 | 444 | 9 |
| 2 | 11 | 444 | 11 |
| 3 | 00 | 343 | 1 |
| 3 | 01 | 343 | 5 |
| 3 | 10 | 331 | 8 |
| 3 | 11 | 331 | 10 |
| 4 | 00 | 001 | 3 |
| 4 | 01 | 001 | 7 |
| 4 | 10 | 000 | 8 |
| 4 | 11 | 000 | 10 |
| 5 | 00 | 113 | 2 |
| 5 | 01 | 100 | 4 |
| 5 | 10 | 100 | 8 |
| 5 | 11 | 100 | 10 |

Fig.7B

| CURRENT STATE | INPUT | OUTPUT | FOLLOWING STATE |
|---|---|---|---|
| 6 | 00 | 443 | 1 |
| 6 | 01 | 443 | 5 |
| 6 | 10 | 444 | 9 |
| 6 | 11 | 444 | 11 |
| 7 | 00 | 331 | 0 |
| 7 | 01 | 344 | 6 |
| 7 | 10 | 344 | 9 |
| 7 | 11 | 344 | 11 |
| 8 | 00 | 133 | 1 |
| 8 | 01 | 133 | 5 |
| 8 | 10 | 013 | 9 |
| 8 | 11 | 013 | 11 |
| 9 | 00 | 311 | 3 |
| 9 | 01 | 311 | 7 |
| 9 | 10 | 431 | 8 |
| 9 | 11 | 431 | 10 |
| 10 | 00 | 013 | 2 |
| 10 | 01 | 134 | 6 |
| 10 | 10 | 134 | 9 |
| 10 | 11 | 134 | 11 |
| 11 | 00 | 431 | 0 |
| 11 | 01 | 310 | 4 |
| 11 | 10 | 310 | 8 |
| 11 | 11 | 310 | 10 |

DECODING METHOD AND RECORDING-MEDIUM REPRODUCING APPARATUS

The present invention relates to a coding method and recording medium, a decoding method, a demodulation method, an error-correcting method, and a recording-medium reproducing apparatus, for subjecting information data to an error-correcting coding and a modulation based on symbol correspondence rules to create channel data, recording the channel data onto a recording medium, and subjecting channel data reproduced from the recording medium to a demodulation based on symbol correspondence rules and an error-correcting decoding to reconstruct the information data.

Among error-correcting methods, the turbo code method has been capturing the spotlight mainly in the communication field by virtue of its having such high performance as to approach the theoretical limit of the transmission rate at which transmission can be achieved without errors (namely, Shannon limit).

Further, studies on applications of the turbo code method to the recording medium field as well, not only the above-noted communication field, have energetically been published.

A recording and reproducing apparatus using this turbo code is explained briefly. FIG. 19 is a schematic diagram of a recording and reproducing apparatus which performs coding and decoding processes of turbo codes. A convolutional coder 1 performs convolutional coding on inputted information data $u_i$ to output code data $c_i$. An interleaver 2 performs a pseudo-random interleaving on the inputted code data $c_i$ to output channel data $a_i$. The channel data $a_i$ outputted in this way is transmitted to a partial response (hereinafter, abbreviated as PR) channel 3. This PR channel 3 has a property that adjacent channel data $a_i$ interfere with each other. As a result of this, an intersymbol interference occurs to a reproduced signal $y'_i$ reproduced from the PR channel 3. Also, the channel data $a_i$, when passing the PR channel 3, undergoes deformation such as noise addition, band limiting or crosstalk. Therefore, the reproduced signal $y'_i$ reproduced from the PR channel 3 has errors added thereto.

A logarithmic-likelihood computing unit 4, to which the reproduced signal $y'_i$ is inputted, computes logarithmic likelihoods $L(y'_i|y_i)$ outputting the logarithmic likelihoods $L(y'_i|y_i)$ of the reproduced signal $y'_i$. It is noted here that $y_i$ is a reproduced signal resulting when the PR channel 3 is ideal. The term 'ideal' refers to a case where there occurs no deformation due to noise or the like so that transfer characteristics of the PR channel 3 are equal to PR transfer characteristics. The logarithmic likelihoods $L(y'_i|y_i)$ are inputted to a code input terminal c;I of an a posteriori probability (hereinafter, sometimes abbreviated as APP) decoder 5 for the PR channel. It is noted here that a symbol with a prime (') indicates that the symbol is data reconstructed after reproduction (that is, indicating addition of errors by the PR channel 3), and a symbol without a prime (') indicates that the symbol is data before recording.

Generally, an APP decoder has 2-input and 2-output terminals, i.e., an information input terminal u;I into which the likelihood of information data is inputted, a code input terminal c;I into which the likelihood of code data is inputted, an information output terminal u;O, from which the likelihood of information data is outputted, and a code output terminal c;O from which the likelihood of code data is outputted. The APP decoder, receiving inputs of an information-data likelihood and a code-data likelihood, updates those likelihoods in compliance with constraints concerning codes. It is noted that a likelihood inputted to the information input terminal u;I is called a priori information. From the information output terminal u;O, a likelihood of updated information data is outputted. From the code output terminal c;O, a likelihood of updated code data is outputted. It is noted that the terms "information data" refers to data inputted to a coder corresponding to an APP decoder, and the terms "code data" refers to data outputted from the coder.

Therefore, in the PR-channel APP decoder 5, logarithmic likelihoods $L(y'_i|y_i)$ of the reproduced signal $y'_i$ are inputted to the code input terminal c;I, and an output $L(a'_i;I)$ of an interleaver 11 is inputted to the information input terminal u;I. Further, from the information output terminal u;O, logarithmic-likelihood ratios $L(a'_i;O)$ of channel data $y'_i$ are outputted. It is noted that the code output terminal c;O, from which the logarithmic likelihoods $L(y'_i;O)$ of the PR channel data $y'_i$ are outputted, is connected to none.

A subtracter 6 subtracts the output $L(a'_i;I)$ of the interleaver 11 from the logarithmic-likelihood ratios $L(a'_i;O)$ of the channel data $a'_i$ derived from the PR-channel APP decoder 5, outputting a subtraction result thereof as an $Lext(a'_i)$. That is, the subtracter 6 calculates a logarithmic-likelihood ratio difference with respect to the channel data $a'_i$.

A deinterleaver 7 performs a deinterleaving of the aforementioned pseudo-random interleaving on the $Lext(a'_i)$ inputted from the subtracter 6, outputting logarithmic-likelihood ratios $L(c'_i;I)$ of the code data $c'_i$. In an APP decoder 8 for convolutional codes, the logarithmic-likelihood ratio $L(c'_i;I)$ derived from the deinterleaver 7 is inputted to the code input terminal c;I, while a zero is inputted to the information input terminal u;I. Then, a logarithmic-likelihood ratio $L(u'_i;O)$ of the information data $u'_i$ is outputted from the information output terminal u;O to information data $u'_i$, while a logarithmic-likelihood ratio $L(c'_i;O)$ of the code data $c'_i$ is outputted from the code output terminal c;O. Thus, the logarithmic-likelihood ratio $L(u'_i;O)$ of the information data $u'_i$ outputted from the information output terminal u;O of the convolutional-code APP decoder 8 is binarized by a comparator 9 and outputted as reconstructed information data $u'_i$.

A subtracter 10 receives an input of the logarithmic-likelihood ratio $L(c'_i;O)$ of the code data $c'_i$ outputted from the code output terminal c;O of the APP decoder 8 for convolutional codes as well as an input of the logarithmic-likelihood ratio $L(c'_i;I)$ of the code data $c'_i$ derived from the deinterleaver 7. Then, the logarithmic-likelihood ratio $L(c'_i;I)$ is subtracted from the logarithmic-likelihood ratio $L(c'_i;O)$, and a subtraction result thereof is outputted as an $Lext(c'_i)$. That is, the subtracter 10 calculates a logarithmic-likelihood ratio difference with respect to the code data $c'_i$.

The interleaver 11 performs the aforementioned pseudo-random interleaving on the $Lext(c'_i)$ inputted from the subtracter 10, outputting logarithmic-likelihood ratios $L(a'_i;I)$ of the channel data $a'_i$. The logarithmic-likelihood ratio $L(a'_i;I)$ of the channel data $a'_i$ outputted from the interleaver 11 in this way is inputted to the information input terminal u;I of the PR-channel APP decoder 5 as described above.

The operation of performing iterative decoding by repeatedly delivering logarithmic-likelihood ratios between the two APP decoders of the PR-channel APP decoder 5 and the convolutional-code APP decoder 8 as described above is referred to as turbo decoding. With the use of this turbo decoding, errors of the reconstructed information data $u'_i$ can be decreased. In this case, at a first-time decoding operation, the $L(a'_i;I)$ to be inputted to the information input terminal u;I of the PR-channel APP decoder 5 is assumed to be zero.

It is noted that the principle of operation of the turbo decoding is described in detail, for example, in Reference 1 "Iterative Correction of Intersymbol Interference: Turbo-Equalization," European Transactions on Telecommunications, Vol. 6, No. 5, pp. 507-511, September-October 1995," and Reference 2 "Concatenated Codes and Iterative (Turbo) Decoding for PRML Optical Recording Channels," Joint International Symposium on Optical Memory and Optical Data Storage 1999, SPIE Vol. 3864, pp. 342-344, July 1999."

In that case, as described above, information to be inputted to the code input terminal c;I of the PR-channel APP decoder 5 needs to be soft information like the logarithmic likelihoods $L(y'_i|y_i)$. Each piece of information to be delivered between the two APP decoders 5, 8 also needs to be soft information like $L(a'_i;O)$, $Lext(c'_i)$, $L(a'_i;I)$, $L(c'_i;O)$, $Lext(a'_i)$ and $L(c'_i;I)$.

In the case where the PR channel 3 is a recording medium, i.e., in the case of a system which performs recording and reproduction on media such as magnetic recording, magneto-optical recording and optical recording, there exist constraints such as band limiting of the PR channel 3, intersymbol interference, clock synchronization and the like. Therefore, the Run Length Limited (hereinafter, referred to as RLL) method is usually used for the modulation method. Generally, RLL data is expressed as RLL(d, k). It is noted here that "d" and "k" represents minimum and maximum run lengths of 0's in a channel data sequence according to the NRZI (non-return-to-zero-inverted) rules.

Referring to the RLL in more detail, polarity inversion intervals of recording waveform sequence are limited to a minimum polarity-inversion interval Tmin and a maximum polarity-inversion interval Tmax. That is, inversion intervals T of recording waveform trains are within the limits of $Tmin \leq T \leq Tmax$. Generally, the minimum polarity-inversion interval Tmin is expressed as $(d+1) \times Tw$. The maximum polarity-inversion interval Tmax is expressed as $(k+1) \times Tw$. It is noted here that "Tw," which denotes the width of a detection window for reproduced signals, is $Tw = \eta \times Tb$, equal to the greatest common measure of polarity-inversion intervals. It is noted that "Tb" denotes a data interval before modulation. The symbol "$\eta$," called code rate, is equal to m/n. That is, pre-modulation m bits are transformed into post-modulation n bits.

These RLL modulation and RLL demodulation are performed generally by logical operation circuits. Otherwise, those modulation and demodulation are achieved by preparatorily storing results of logical operations in ROM (Read-only Memory) and referring to this ROM as a table. Therefore, input data of the RLL demodulation is hard information, and output data of the RLL demodulation is also hard information.

FIG. 20 is a schematic diagram of a conventional recording and reproducing apparatus in which the RLL modulation method is applied to transmission and reproduction of information to the PR channel. An error-correcting coder 15 performs error-correcting coding on inputted information data $u_i$, and outputs code data $c_i$. An RLL modulator 16 performs RLL modulation on inputted code data $c_i$, and outputs channel data $a_i$. The channel data $a_i$ outputted in this way is transmitted to a PR channel 17.

As described above, a reproduced signal $y'_i$ reproduced from the PR channel 17 has errors added thereto. The maximum likelihood (hereinafter, abbreviated as ML) decoder 18 presumes and outputs channel data $a'_i$ from the inputted reproduced signal $y'_i$ based on intersymbol interference due to characteristics of the PR channel 17 and on the RLL condition. It is noted here that the terms "RLL condition" mean that inversion intervals T of recording waveform trains are within the limits of $Tmin \leq T \leq Tmax$. The ML decoding, which is generally calculated according to Viterbi algorithms, is often called Viterbi decoding. It is noted here that the ML decoder 18 in principle outputs presuming results as hard information. That is, the presumed channel data $a'_i$ is binary data.

An RLL demodulator 19 performs a demodulation on the reconstructed channel data $a'_i$, outputting reconstructed code data $c'_i$. An error-correcting decoder 20 performs on the inputted code data $c'_i$ correction of the errors added in the PR channel 17, outputting reconstructed information data $u'_i$.

The method in which data reproduced from the PR channel 17 is processed for ML decoding in the manner as described above is called PRML (Partial Response Maximum Likelihood) method, and is widely used for recording-medium reproducing apparatus.

FIG. 21 is a block diagram showing the construction of a conventional RLL demodulator 19. Reconstructed channel data $a'_i$ outputted from the ML decoder 18 shown in FIG. 20 is inputted to a p-stage shift register 21. Generally, the number p of stages of this shift register 21 is not less than n. The p-stage shift register 21 shifts data in steps of the interval Tw, outputting parallel data $(a'_1, a'_2, \ldots, a'_k, \ldots, a'_p)$. A logical operation circuit 22, receiving inputs of the parallel data $(a'_1, a'_2, \ldots, a'_k, \ldots, a'_p)$, performs the above-described logical operations, outputting post-demodulation parallel data $(c'_1, c'_2, \ldots, c'_j, \ldots, c'_m)$. An m-stage shift register 23 with a parallel load function performs parallel loading of the post-demodulation parallel data $(c'_1, c'_2, \ldots, c'_j, \ldots, c'_m)$, and shifts the data in steps of the interval Tb, outputting post-demodulation serial data $c'_i$. The above logical operation and parallel loading are performed synchronously every interval $(m \times Tb)$.

As described above, the RLL demodulator 19, receiving an input of hard-information (i.e., binarized) channel data $a'_i$, performs demodulation on the data, outputting hard-information (i.e., binarized) post-demodulation code data $c'_i$.

However, the above-described conventional recording and reproducing apparatus has problems shown below.

As described above, in the case where the RLL modulation method is used, the RLL demodulator 19 outputs code data $c'_i$ as hard information. On one hand, channel data $a'_i$ to be inputted to the RLL demodulator 19 needs to be hard information. On the other hand, for the turbo decoding method that uses two APP decoders, the PR-channel APP decoder 5 and the convolutional-code APP decoder 8, as shown in FIG. 19, it is necessary to input reconstructed code data $c'_i$ as soft information.

Therefore, in making up a recording and reproducing apparatus which adopts the above PR channel 17 as a recording medium, the turbo decoder is unusable and the PRML has to be used since the RLL demodulator 19 is used. Therefore, as compared with the case where a turbo decoder is used, there are problems that recording density to the recording medium lowers and that stricter tolerances are required for the recording medium and the recording and reproducing apparatus.

It is noted here that the term "tolerances" refers to allowable errors in parameters that would cause increases in errors of reconstructed information data. The parameters of a recording medium are exemplified by distortions expressed by tangential tilts or radial tilts, medium noise, and the like. When the recording medium is an optical disk, the parameters also include thickness errors of the cover glass, refractive index, birefringence, and the like. On the other hand, the parameters of the recording and reproducing apparatus include, for example, a detracking amount of the tracking servo, recording power, and the like. For recording and reproducing apparatuses adopting the optical recording or magneto-optical recording scheme, the parameters further include aberrations of objective lenses, offsets of the focusing servo (defocus amount), reproducing power, and the like.

SUMMARY OF THE INVENTION

Therefore, an object of the present invention is to provide a decoding method using a turbo decoding to which the RLL demodulation method is applied, and a recording-medium reproducing apparatus using this decoding method.

In order to achieve the above object, in a first aspect of the present invention, there is provided a decoding method for decoding of data which has been subjected to a modulation so as to be formed into channel data, the channel data being to be reproduced over a passage through a channel, where the decoding of data is performed based on reproduced data of the channel data, wherein the decoding is performed through an APP decoding process in compliance with constraints representing correspondence between data before being subjected to the RLL modulation and channel data to be obtained after having passed though the channel, including constraints concerning the modulation.

With this constitution, it becomes possible to demodulate and output data as soft information based on the reproduced data. Therefore, in combination with a turbo decoding process, the turbo decoding suitable for reproduction of a recording medium becomes implementable.

In an embodiment, the modulation is RLL modulation, the channel has a PR transfer characteristic, and the constraints representing the correspondence between the data and the channel data that are used in the APP decoding process are constraints that satisfy both constraints concerning the RLL modulation and constraints concerning the PR transfer characteristic.

According to this embodiment, an RLL modulation suitable for a recording medium which is a PR channel, as well as the APP decoding process, are achieved.

In an embodiment, the APP decoding process is performed based on trellis diagram information representing the constraints representing the correspondence between the data and the channel data and stored in memory.

According to this embodiment, the APP decoding process is performed in a simple process by looking up to the trellis diagram information stored in the memory.

In a second aspect of the invention, there is provided a decoding method for decoding of information data which has been subjected to an error-correcting coding so as to be formed into code data, the code data being subjected sequentially to a pseudo-random substitution and a modulation so as to be formed into channel data, the channel data being to be reproduced over a passage through a channel, where the information data is decoded based on reproduced data of the channel data, the decoding method comprising:

computing bit-wise probabilities of the reproduced data by probability computing means;

performing, by first APP decoding means, a first APP decoding process for, upon receiving inputs of bit-wise probabilities of the reproduced data and first a priori information concerning the code data, creating and outputting first a posteriori probabilities of the code data in compliance with constraints representing correspondence between code data before being subjected to the RLL modulation and channel data to be obtained after having passed through the channel, including constraints concerning the modulation;

performing, by deinterleaving means, a deinterleaving process for subjecting, to deinterleaving the pseudo-random interleaving, a probability value relating to a first a posteriori probability of the code data ouputted from the first APP decoding means by deinterleaving means to thereby create and output second a priori information concerning the code data;

performing, by second APP decoding means, a second APP decoding process for, upon receiving an input of the second a priori information concerning code data, creating and outputting a posteriori probability of the information data and a second a posteriori probability of the code data in compliance with constraints concerning error-correcting codes;

performing, by interleaving means, an interleaving process for subjecting, to the pseudo-random interleaving, a probability value relating to the second a posteriori probability of the code data outputted from the second APP decoding means to thereby create and output first a priori information concerning the code data;

performing, by first computing means, a first computation process for either creating first extrinsic information concerning code data updated by the first APP decoding process based on the probability value before the inverse substitution process and the probability value after the substitution process and outputting the first extrinsic information to the inverse substitution means as a probability value relating to the first a posteriori probability, or for creating the first extrinsic information based on the probability value after the inverse deinterleaving process and the probability value before the interleaving process and outputting the first extrinsic information to the second APP decoding means as the second a priori information; and performing, by second computing means, a second computation process for either creating second extrinsic information concerning code data updated by the second APP decoding process based on the probability value before the substitution process and the probability value after the deinterleaving process and outputting the second extrinsic information to the substitution means as a probability value relating to the second a posteriori probability, or for creating second extrinsic information based on the probability value after the substitution process and the probability value before the deinterleaving process and outputting the second extrinsic information to the first APP decoding means as the first a priori information, the above processes being iteratively performed to implement an iterative decoding.

With this constitution, by the first APP decoding process for performing turbo decoding together with the second APP decoding process, in response to inputs of a bit-wise probability of reproduced data and first a priori information concerning code data, a first a posteriori probability of the code data is created and outputted in compliance with the constraints including constraints concerning a modulation to which the information data has been subjected in recording. Thus, a turbo decoding method to which a demodulation capable of treating soft information is applied, i.e., a turbo decoding method suitable for reproduction of a recording medium, is realized.

In a third aspect of the invention, there is provided a decoding method for decoding of information data which has been subjected to an error-correcting coding so as to be formed into code data, the code data being subjected to a modulation so as to be formed into channel data, the channel data being to be reproduced over a passage through a channel, where the information data is decoded based on reproduced data of the channel data, the decoding method comprising:

computing bit-wise probabilities of the reproduced data by probability computing means;

upon an input of a bit-wise probability of the reproduced data, creating an a posteriori probability of the code data in a first APP decoding process performed by the first APP decoding means in compliance with constraints representing correspondence between code data before being subjected to the RLL and channel data to be obtained after having passed through the channel, including constraints concerning the modulation, to output the a posteriori probability of the code data; and upon an input of the a posteriori probability of the code data, creating an a posteriori probability of the information data in a second APP decoding process performed by a second APP decoding means in compliance with constraints concerning error-correcting codes, to output the a posteriori probability of the information data.

With this constitution, by the first APP decoding process, in response to an input of a bit-wise probability of reproduced data, an a posteriori probability of the code data is created and outputted in compliance with constraints containing constraints concerning a modulation to which the information data has been subjected in recording. Then, by the second APP decoding process, in response to an input of soft information comprised of an a posteriori probability of the code data, an a posteriori probability of the information data is created and outputted in compliance with the constraints concerning error-correcting codes to which the information data has been subjected in recording. In this way, a decoding method which involves a preceding-stage demodulation capable of treating soft information, i.e., a decoding method suitable for reproduction of a recording medium, is realized.

In a fourth aspect of the invention, there is provided a decoding method for decoding of information data which has been subjected to an error-correcting coding so as to be formed into code data, the code data being subjected to a modulation so as to be formed into channel data, the channel data being to be reproduced over a passage through a channel, where the information data is decoded based on reproduced data of the channel data, the decoding method comprising:

computing bit-wise probabilities of the reproduced data by probability computing means;

performing, by first APP decoding means, a first APP decoding process for, upon inputs of a bit-wise probability of the reproduced data and a priori information concerning code data, creating and outputting an a posteriori probability of the code data in compliance with constraints representing correspondence between code data before being subjected to the RLL modulation and channel data to be obtained after having passed through the channel, including constraints concerning the modulation; and performing, by second APP decoding means, a second APP decoding process for, upon an input of an a posteriori probability of the code data, creating and outputting an a posteriori probability of the information data and a priori information concerning code data in compliance with constraints concerning error-correcting codes, the said decoding processes being iteratively performed to implement an iterative decoding.

With this constitution, by the first APP decoding process for performing turbo decoding together with the first APP decoding process, in response to inputs of a bit-wise probability of reproduced data and a priori information concerning code data, a posteriori probability of the code data is created and outputted in compliance with constraints containing constraints concerning a modulation to which the information data has been subjected in recording. Then, by the second APP decoding process, in response to an input of soft information comprised of an a posteriori probability of the code data, an a posteriori probability of the information data and a priori information concerning code data are created and outputted in compliance with the constraints concerning error-correcting codes to which the information data has been subjected in recording. Thus, an iterative decoding method to which a demodulation capable of treating soft information is applied, i.e., an iterative decoding method suitable for reproduction of a recording medium, is achieved.

In the decoding method according to any one of the second to fourth aspects of the invention, the error-correcting coding may be a turbo coding, and in this case, the second APP decoding process is a turbo decoding process corresponding to the turbo coding.

With this constitution, a turbo decoding method which involves a preceding-stage demodulation capable of treating soft information or a turbo decoding method to which a demodulation capable of treating soft information is applied, i.e., a turbo decoding method suitable for reproduction of a recording medium, is achieved.

In the decoding method according to any one of the second to fourth aspects of the invention, the modulation may be an RLL modulation, the channel may have a PR transfer characteristic, and the constraints representing the correspondence between the code data and the channel data that are used in the first APP decoding process may be constraints that meet both constraints concerning the RLL modulation and constraints concerning the PR transfer characteristic.

In this case, an RLL modulation suitable for a recording medium serving as the PR channel, and the first APP decoding process are implemented.

Further, the first APP decoding process may be performed in compliance with trellis diagram information representing the constraints representing the correspondence between the code data and the channel data and stored in a memory.

In this case, the first APP decoding is performed in a simple process by looking up to the trellis diagram information stored in the memory.

Further, the error-correcting coding may be convolutional coding.

In this case, an error-correcting coding suitable for turbo decoding is implemented.

Further, logarithmic-likelihood ratios may be used as the probability and a posteriori probability, while logarithmic-likelihood ratio values may be used as the a priori information and extrinsic information.

In this case, reductions in computing amount are achieved in the fulfillment of the computations, creation, transformation or other processes performed by the probability computing means, the first APP decoding means, the first computing means, the deinterleaving means, the second APP decoding means, the second computing means and the substitution means.

In a fifth aspect of the invention, there is provided a recording-medium reproducing apparatus comprising:

reproduction means for, from a recording medium on which channel data is recorded, the channel data resulting from subjecting information data to error-correcting coding to create code data, which code data is subjected to pseudo-random interleaving and RLL modulation, reproducing the recorded channel data and outputting the reproduced data; and decoding means for obtaining a posteriori probabilities of the information data from the reproduced data by the decoding method according to the second aspect of the invention, and reconstructing the information data according to the a posteriori probabilities of the information data.

As is obvious from the forgoing description, the decoding means comprises the probability computing means, the first APP decoding means, the inverse substitution means, the second APP decoding means, the substitution means, the first computing means, and the second computing means.

With this constitution, by applying constraints concerning RLL modulation as the constraints representing the correspondence between the code data and the channel data to be used in the first APP decoding process performed by the decoding means, it becomes possible to perform reproduction and decoding of a recording medium by a decoding method to which RLL demodulation and turbo decoding are applied. As a result, the recording density on the recording medium is enhanced. Further, tolerances for recording media and tolerances for the recording-medium reproducing apparatus can be relaxed, that is, such tolerances are allowed to be larger.

In a sixth aspect of the invention, there is provided a recording-medium reproducing apparatus comprising:

reproduction means for, from a recording medium on which channel data is recorded, the channel data resulting from subjecting information data to error-correcting coding to create code data, which code data is subjected to RLL modulation, reproducing the recorded channel data and outputting the reproduced data; and decoding means for obtaining a posteriori probabilities of the information data from the reproduced data by the decoding method according to the third or fourth aspect of the invention, and reconstructing the information data according to the a posteriori probabilities of the information data.

In this apparatus, as is obvious from the foregoing description, the decoding means comprises the probability computing means, the first APP decoding means, and the second APP decoding means.

With this constitution, by applying constraints concerning RLL modulation as the constraints representing the correspondence between the code data and the channel data to be used in the first APP decoding process performed by the decoding means and moreover by applying a turbo decoding process as the second APP decoding process performed by the decoding means, it becomes possible to perform reproduction and decoding of a recording medium by a decoding method to which RLL demodulation and turbo decoding are applied. As a result, the recording density on the recording medium is enhanced. Further, tolerances for recording media and tolerances for the recording-medium reproducing apparatus can be relaxed, that is, such tolerances are allowed to be larger.

In a seventh aspect of the present invention, there is provided a decoding method for decoding of data which has been subjected to a modulation so as to be formed into channel data, the channel data being to be reproduced over a passage through a channel, where the decoding of data is performed based on reproduced data of the channel data, wherein the decoding is performed through an APP decoding process in compliance with constraints concerning the modulation.

With this constitution, it becomes possible to demodulate and output data as soft information based on the reproduced data. Therefore, in combination with a turbo decoding process, the turbo decoding suitable for reproduction of a recording medium becomes implementable.

In an embodiment, the modulation is an RLL modulation, the channel is equalized so as to satisfy Nyquist's first criterion, and the constraints concerning the modulation to be used in the APP decoding process are constraints concerning the RLL modulation.

According to this embodiment, an RLL modulation suitable for a recording medium which is a channel equalized so as to satisfy the Nyquist's first criterion, namely, a channel free from the intersymbol interference, as well as the APP decoding process, is achieved.

In an embodiment, the APP decoding process is performed based on trellis diagram information representing the constraints concerning the modulation and stored in a memory.

According to this embodiment, the APP decoding process is performed in a simple process by looking up to the trellis diagram information stored in the memory.

In an eighth aspect of the invention, there is provided a decoding method for decoding of information data which has been subjected to an error-correcting coding so as to be formed into code data, the code data being subjected sequentially to a pseudo-random interleaving and a modulation so as to be formed into channel data, the channel data being to be reproduced over a passage through a channel, where the information data is decoded based on reproduced data of the channel data wherein the RLL modulation is expressible by a conversion table listing combinations of preceding channel bits, current input bits, succeeding input bits, and channel bits to be output, the decoding method comprising:

computing bit-wise probabilities of the reproduced data by probability computing means;

performing, by first APP decoding means, a first APP decoding process for, upon receiving inputs of bit-wise probabilities of the reproduced data and first a priori information concerning the code data, creating and outputting first a posteriori probabilities of the code data in compliance with constraints concerning the modulation;

performing, by deinterleaving means, a deinterleaving process for subjecting, to deinterleaving the pseudo-random interleaving, a probability value relating to a first a posteriori probability of the code data outputted from the first APP decoding means by deinterleaving means to thereby create and output second a priori information concerning the code data;

performing, by second APP decoding means, a second APP decoding process for, upon receiving an input of the second a priori information concerning code data, creating and outputting a posteriori probability of the information data and a second a posteriori probability of the code data in compliance with constraints concerning error-correcting codes;

performing, by interleaving means, an interleaving process for subjecting, to the pseudo-random interleaving, a probability value relating to the second a posteriori probability of the code data outputted from the second APP decoding means to thereby create and output first a priori information concerning the code data;

performing, by first computing means, a first computation process for either creating first extrinsic information concerning code data updated by the first APP decoding process based on the probability value before the deinterleaving process and the probability value after the interleaving process and outputting the first extrinsic information to the deinterleaving means as a probability value relating to the first a posteriori probability, or for creating the first extrinsic information based on the probability value after the deinterleaving process and the probability value before the interleaving process and outputting the first extrinsic information to the second APP decoding means as the second a priori information, which constraints are expressed by trellis diagram information in which contents in the conversion table are regarded as trellis code; and performing, by second computing means, a second computation process for either creating second extrinsic information concerning code data updated by the second APP decoding process based on the probability value before the interleaving process and the probability value after the deinterleaving process and outputting the second extrinsic information to the interleaving means as a probability value relating to the second a posteriori probability, or for creating second extrinsic information based on the probability value after the interleaving process and the probability value before the deinterleaving process and outputting the second extrinsic information to the first APP decoding means as the first a priori information, the above processes being iteratively performed to implement an iterative decoding.

With this constitution, by the first APP decoding process for performing turbo decoding together with the second APP decoding process, in response to inputs of a bit-wise probability of reproduced data and first a priori information concerning code data, a first a posteriori probability of the code data is created and outputted in compliance with the constraints including constraints concerning a modulation to which the information data has been subjected in recording. Thus, a turbo decoding method to which a demodulation capable of treating soft information is applied, i.e., a turbo decoding method suitable for reproduction of a recording medium, is realized.

In a ninth aspect of the invention, there is provided a decoding method for decoding of information data which has been subjected to an error-correcting coding so as to be formed into code data, the code data being subjected to a modulation so as to be formed into channel data, the channel data being to be reproduced over a passage through a channel, where the information data is decoded based on reproduced data of the channel data, wherein the RLL modulation is expressible by a conversion table listing combinations of preceding channel bits, current input bits, succeeding input bits, and channel bits to be output, the decoding method comprising:

computing bit-wise probabilities of the reproduced data by probability computing means;

upon an input of a bit-wise probability of the reproduced data, creating an a posteriori probability of the code data in a first APP decoding process performed by the first APP decoding means in compliance with constraints concerning the modulation, to output the a posteriori probability of the code data, the constraints being expressed by trellis diagram information in which contents in the conversion table are regarded as trellis code; and upon an input of the a posteriori probability of the code data, creating an a posteriori probability of the information data in a second APP decoding process performed by a second APP decoding means in compliance with constraints concerning error-correcting codes, to output the a posteriori probability of the information data.

With this constitution, by the first APP decoding process, in response to an input of a bit-wise probability of reproduced data, an a posteriori probability of the code data is created and outputted in compliance with constraints containing constraints concerning a modulation to which the information data has been subjected in recording. Then, by the second APP decoding process, in response to an input of soft information comprised of an a posteriori probability of the code data, an a posteriori probability of the information data is created and outputted in compliance with the constraints concerning error-correcting codes to which the information data has been subjected in recording. In this way, a decoding method which involves a preceding-stage demodulation capable of treating soft information, i.e., a decoding method suitable for reproduction of a recording medium, is realized.

In a tenth aspect of the invention, there is provided a decoding method for decoding of information data which has been subjected to an error-correcting coding so as to be formed into code data, the code data being subjected to a modulation so as to be formed into channel data, the channel data being to be reproduced over a passage through a channel, where the information data is decoded based on reproduced data of the channel data, the decoding method comprising:

computing bit-wise probabilities of the reproduced data by probability computing means;

performing, by first APP decoding means, a first APP decoding process for, upon inputs of a bit-wise probability of the reproduced data and a priori information concerning code data, creating and outputting an a posteriori probability of the code data in compliance with constraints concerning the modulation; and performing, by second APP decoding means, a second APP decoding process for, upon an input of an a posteriori probability of the code data, creating and outputting an a posteriori probability of the information data and a priori information concerning code data in compliance with constraints concerning error-correcting codes, the said decoding processes being iteratively performed to implement an iterative decoding.

With this constitution, by the first APP decoding process for performing turbo decoding together with the first APP decoding process, in response to inputs of a bit-wise probability of reproduced data and a priori information concerning code data, a posteriori probability of the code data is created and outputted in compliance with constraints containing constraints concerning a modulation to which the information data has been subjected in recording. Then, by the second APP decoding process, in response to an input of soft information comprised of an a posteriori probability of the code data, an a posteriori probability of the information data and a priori information concerning code data are created and outputted in compliance with the constraints concerning error-correcting codes to which the information data has been subjected in recording. Thus, an iterative decoding method to which a demodulation capable of treating soft information is applied, i.e., an iterative decoding method suitable for reproduction of a recording medium, is achieved.

In the decoding method according to any one of the eighth to tenth aspects of the invention, the error-correcting coding may be a turbo coding, and in this case, the second APP decoding process is a turbo decoding process corresponding to the turbo coding.

With this constitution, a turbo decoding method which involves a preceding-stage demodulation capable of treating soft information or a turbo decoding method to which a demodulation capable of treating soft information is applied, i.e., a turbo decoding method suitable for reproduction of a recording medium, is achieved.

In the decoding method according to any one of the eighth to tenth aspects of the invention, the modulation may be an RLL modulation. In this case, the channel is equalized so as to satisfy Nyquist's first criterion, and the constraints concerning the modulation to be used in the first APP decoding process are constraints concerning the RLL modulation.

In this case, an RLL modulation suitable for a recording medium serving as a channel that is equalized to meet the Nyquist's first criterion, namely, a channel free from the intersymbol interference, and the first APP decoding process are implemented.

Further, the first APP decoding process may be performed in compliance with trellis diagram information representing the constraints concerning the modulation and stored in a memory.

In this case, the first APP decoding is performed in a simple process by looking up to the trellis diagram information stored in the memory.

Further, the error-correcting coding may be convolutional coding.

In this case, an error-correcting coding suitable for turbo decoding is implemented.

Further, logarithmic-likelihood ratios may be used as the probability and a posteriori probability, while logarithmic-likelihood ratio values may be used as the a priori information and extrinsic information.

In this case, reductions in computing amount are achieved in the fulfillment of the computations, creation, transformation or other processes performed by the probability computing means, the first APP decoding means, the first computing means, the deinterleaving means, the second APP decoding means, the second computing means and the substitution means.

In an 11th aspect of the invention, there is provided a recording-medium reproducing apparatus comprising:

reproduction means for, from a recording medium on which channel data is recorded, the channel data resulting from subjecting information data to error-correcting coding to create code data, which code data is subjected to pseudo-random interleaving and RLL modulation, reproducing the recorded channel data and outputting the reproduced data; and decoding means for obtaining a posteriori probabilities of the information data from the reproduced data by the decoding method according to the eighth aspect of the invention, and reconstructing the information data according to the a posteriori probabilities of the information data.

As is obvious from the forgoing description, the decoding means comprises the probability computing means, the first APP decoding means, the deinterleaving means, the second APP decoding means, the interleaving means, the first computing means, and the second computing means.

With this constitution, by applying constraints concerning RLL modulation as the constraints concerning the modulation to be used in the first APP decoding process performed by the decoding means, it becomes possible to perform reproduction and decoding of a recording medium by a decoding method to which RLL demodulation and turbo decoding are applied. As a result, the recording density on the recording medium is enhanced. Further, tolerances for recording media and tolerances for the recording-medium reproducing apparatus can be relaxed, that is, such tolerances are allowed to be larger.

In a 12th aspect of the invention, there is provided a recording-medium reproducing apparatus comprising:

reproduction means for, from a recording medium on which channel data is recorded, the channel data resulting from subjecting information data to error-correcting coding to create code data, which code data is subjected to RLL modulation, reproducing the recorded channel data and outputting the reproduced data; and decoding means for obtaining a posteriori probabilities of the information data from the reproduced data by the decoding method according to the ninth or tenth aspect of the invention, and reconstructing the information data according to the a posteriori probabilities of the information data.

In this apparatus, as is obvious from the foregoing description, the decoding means comprises the probability computing means, the first APP decoding means, and the second APP decoding means.

With this constitution, by applying constraints concerning RLL modulation as the constraints concerning the modulation to be used in the first APP decoding process performed by the decoding means and moreover by applying a turbo decoding process as the second APP decoding process performed by the decoding means, it becomes possible to perform reproduction and decoding of a recording medium by a decoding method to which RLL demodulation and turbo decoding are applied. As a result, the recording density on the recording medium is enhanced. Further, tolerances for recording media and tolerances for the recording-medium reproducing apparatus can be relaxed, that is, such tolerances are allowed to be larger.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 shows a modulation table of RLL(1, 7) standardized by standard ECMA-195;

FIG. 4 shows a conversion table for transforming channel data $z_i$ based on the NRZI rules into channel data $a_i$ based on the NRZ rules;

FIGS. 6A and 6B show correspondence tables showing correspondence between the current state, input, output, and the following state based on the trellis diagram shown in FIG. 5;

FIGS. 7A and 7B show correspondence tables showing correspondence between the current state, input, output, and the following state in the case of the PR transfer characteristic being (1, 2, 1);

DETAILED DESCRIPTION OF THE PREFERRED EMBODIMENTS

Hereinbelow, the present invention is described in detail by way of embodiments thereof illustrated in the accompanying drawings.

First Embodiment

Figure 1:
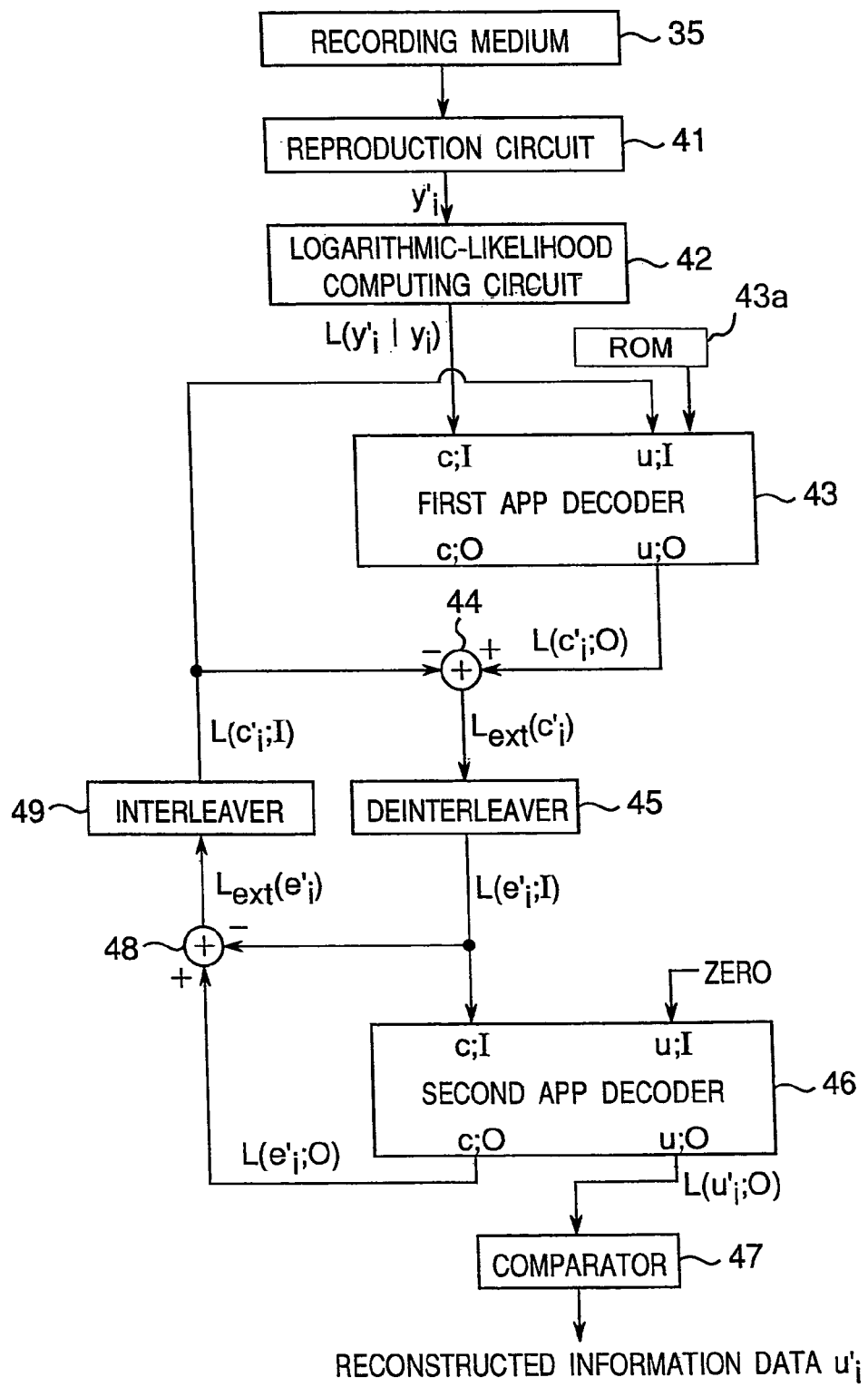
FIG. 1 is a block diagram of a recording-medium reproducing apparatus in a first embodiment of the present invention.
Figure 2:
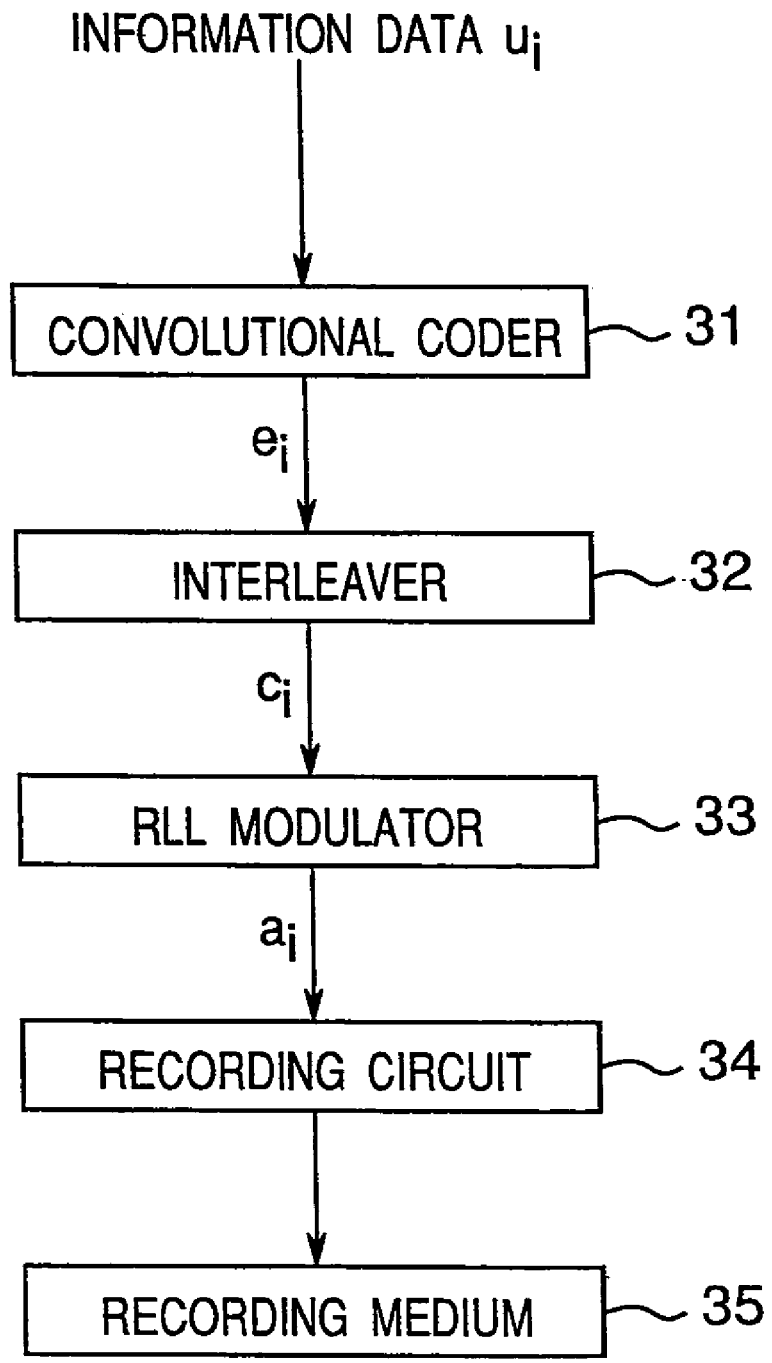
FIG. 2 is a block diagram of a recording-medium recording apparatus for recording data which is reproduced by the recording-medium reproducing apparatus shown in FIG. 1 or 16.

FIG. 1 is a block diagram of a recording-medium reproducing apparatus of the present invention. FIG. 2 is a block diagram of a recording-medium recording apparatus which records, on a recording medium, channel data $a_i$ reproduced by the recording-medium reproducing apparatus shown in FIG. 1. First, the recording-medium recording apparatus is explained.

In the recording-medium recording, apparatus shown in FIG. 2, a convolutional coder 31 performs convolutional coding on inputted information data $u_i$, outputting code data $e_i$. An interleaver 32 performs pseudo-random interleaving on the inputted code data $e_i$, outputting interleaved code data $c_i$. An RLL modulator 33 performs RLL modulation on the inputted interleaved code data $c_i$, outputting channel data $a_i$. The channel data $a_i$ outputted in this way are recorded on a recording medium 35 by a recording circuit 34. It is noted that the recording circuit 34 implements the recording by magnetic recording, magneto-optical recording, optical recording or the like. Thus, this recording-medium recording apparatus performs both turbo coding and RLL modulation.

Next, the recording-medium reproducing apparatus shown in FIG. 1 will be explained. A reproduction circuit 41 reproduces channel data recorded on the recording medium 35, and outputs the reproduced signal $y'_i$. The recording circuit 34, the recording medium 35 and the reproduction circuit 41, which constitute a PR channel, have a property that adjacent channel data $a_i$ interfere with each other. Due to this, intersymbol interference has occurred to the reproduced signal $y'_i$. Besides, the reproduced signal $y'_i$, when passing the PR channel, undergoes deformation such as noise addition, band limiting or crosstalk. Therefore, the reproduced signal $y'_i$ contains errors.

A logarithmic-likelihood computing circuit 42 serving as the probability computing means computes a logarithmic likelihood based on the inputted reproduced signal $y'_i$, and outputs the logarithmic likelihood $L(y'_i|y'_i)$ of the reproduced signal $y'_i$. This logarithmic likelihood $L(y'_i|y_i)$ is then inputted to a code input terminal c;I of a first APP decoder 43. Further, an output $L(c'_i;I)$ of an interleaver 49 serving as the interleaving means is inputted to an information input terminal u;I of the first APP decoder 43. The $L(c'_i;I)$, in which extrinsic information of code data $e'_i$ updated by a later-described second APP decoder 46 has been interleaved, is inputted to the first APP decoder 43 as a priori information of the code data $c'_i$.

The first APP decoder 43 performs APP decoding in compliance with constraints based on the code data $c'_i$ and the channel data. Details of the first APP decoder 43 will be described later. Then, the first APP decoder 43 outputs a posteriori probabilities $L(c'_i;O)$ of the code data $c'_i$ from the information output terminal u;O. The code output terminal c;O, from which the a posteriori probabilities $L(y'_i;O)$ of the PR channel data $y'_i$ are outputted, is connected to none. That is, the first APP decoder 43 updates the individual likelihoods according to the constraints representing the correspondence between the code data $c'_i$ and the channel data.

It is noted here that logarithmic-likelihood ratios are used to express probability values. For example, the logarithmic-likelihood ratio concerning code data $c_i$ is defined by the following equation:

$$L(c'_i) = \ln \frac{P(c'_i|c_i = 1)}{P(c'_i|c_i = 0)} \tag{1}$$

where $P(c'_i|c_i=1)$ is a conditional probability at which reconstructed code data is $c'_i$ when transmitted code data $c_i$ is 1, and similarly $P(c'_i|c_i=0)$ is a conditional probability at which reconstructed code data is $c'_i$ when transmitted code data $c_i$ is 0. In addition, "ln" represents a natural logarithmic function. Further, as will be described later, logarithmic likelihoods are used to express probabilities of reproduced signals.

A first subtracter 44 as the first computing means operates immediately after a posteriori probabilities $L(c'_i;O)$ of the code data $c'_i$ are outputted from the first APP decoder 43. The first subtracter 44 subtracts outputs $L(c'_i;I)$, described later, of the interleaver 49 from the a posteriori probabilities $L(c'_i;O)$, and outputs the subtraction results as $\text{Lext}(c'_i)$. That is, the first subtracter 44 calculates a difference between logarithmic-likelihood ratio of code data $c'_i$ before and after updating by the first APP decoder 43. This difference is called extrinsic information. A deinterleaver 45 serving as the deinterleaving means performs a deinterleaving of the aforementioned pseudo-random interleaving on the extrinsic information Lext($c'_i$) inputted from the first subtracter 44, and outputs logarithmic-likelihood ratios L($e'_i$;I) of post-deinterleaving (i.e., pre-interleaving) code data $e'_i$.

In the second APP decoder 46, the logarithmic-likelihood ratios L($e'_i$;I) derived from the deinterleaver 45 are inputted to the code input terminal c;I, while a zero is inputted to the information input terminal u;I. The logarithmic-likelihood ratios L($e'_i$;I) obtained by deinterleaving extrinsic information associated with the code data $c'_i$ updated by the first APP decoder 43 are inputted to the second APP decoder 46 as a priori information associated with the code data $e'_i$.

The second APP decoder 46 performs APP decoding in compliance with the constraints concerning convolutional codes. Then, the second APP decoder 46 outputs an a posteriori probability L($u'_i$;O) of information data $u'_i$ from an information output terminal u;O, and meanwhile outputs an a posteriori probability L($e'_i$;O) of code data $e'_i$ from a code output terminal c;To. That is, the second APP decoder 46 updates each likelihood in compliance with constraints concerning convolutional codes. Thus, the a posteriori probability L($u'_i$;O) of the information data $u'_i$ outputted from the information output terminal u;O of the second APP decoder 46 is binarized by a comparator 47 and outputted as reconstructed information data $u'_i$.

A second subtracter 48 serving as the second computing means operates immediately after the a posteriori probability L($e'_i$;O) of code data $e'_i$ has been outputted from the second APP decoder 46. Then, the second subtracter 48, upon receiving inputs of the logarithmic-likelihood ratio L($e'_i$;I) of code data $e'_i$ derived from the deinterleaver 45 and the a posteriori probability L($e'_i$;O), subtracts the logarithmic-likelihood ratio L($e'_i$;I) from the a posteriori probability L($e'_i$;O), and outputs a subtraction result Lext($e'_i$). That is, the second subtracter 48 calculates a difference between logarithmic-likelihood ratios of code data $e'_i$ before and after updating by the second APP decoder 46. This difference is also called extrinsic information.

The interleaver 49 performs the pseudo-random interleavihg on the extrinsic information Lext($e'_i$) derived from the second subtracter 48, and outputs a logarithmic-likelihood ratio L($c'_i$;I) of the code data $c'_i$. The logarithmic-likelihood ratio L($c'_i$;I) outputted in this way is inputted to the first subtracter 44 and the information input terminal u;I of the first APP decoder 43 as described above.

In this way, turbo decoding is performed by repeatedly delivering logarithmic-likelihood ratios of code data between the first APP decoder 43 and the second APP decoder 46, allowing the reconstructed information data $u'_i$ to be reduced in errors. In this case, at a first-time decoding operation, a zero L($c'_i$;I) is inputted to the information input terminal u;I of the first APP decoder 43.

Next, operation of the first APP decoder 43 will be described concretely. FIG. 3 is a modulation table of RLL(1, 7) standardized by standard ECMA-195 of Standardizing Information and Communication Systems. In this case, the number m of bits of pre-modulation code data is 2 (m=2) and the number n of bits of post-modulation channel data is 3 (n=3). In the modulation table shown in FIG. 3, a "1" of channel bits represents a polarity inversion of the reproduced signal, and a "0" of channel bits represents an obtainment of the same polarity as the preceding bit (i.e., preceding-polarity holding). Such a signal is referred to as a signal based on the NRZI rules. This modulation table allows the RLL modulator 33 to compute three bits of post-modulation channel data by referring to four bits of pre-modulation code data and one bit of channel data modulated immediately before.

Figure 4:
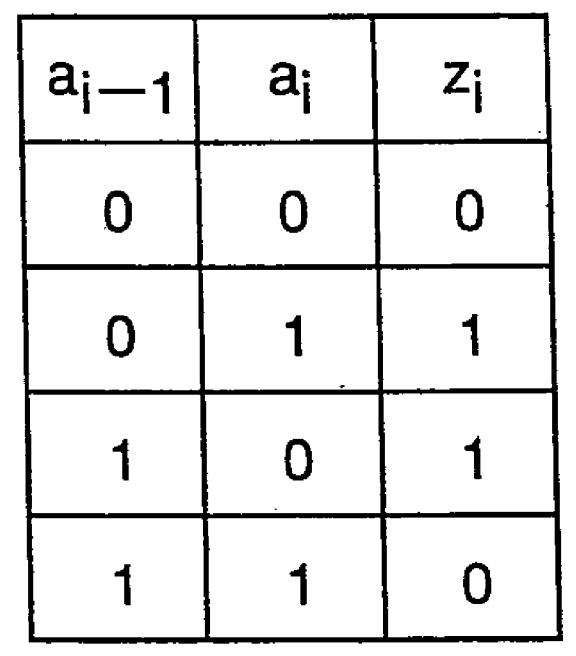

It is noted that channel data $z_i$ based on the NRZI rules are converted into channel data $a_i$ based on the NRZ rules (hereinafter, referred to as NRZ transform) by the RLL modulator 33, and recorded on the recording medium 35. FIG. 4 is a conversion table for performing the conversion. The polarity to be recorded on the recording medium 35 by the recording circuit 34 in FIG. 2 is based on channel data $a_i$ that accords to the NRZ rules.

The RLL modulator 33 is capable of sequentially receiving inputs of 2 bits of pre-modulation code data $c_i$ and, in response to this, sequentially outputting 3 bits of post-modulation channel data $a_i$. In this case, values of the 3 bits of channel data $a_i$ to be outputted are related not only to the currently inputted 2 bits of code data $c_i$ but to 2 bits of code data $c_i$ inputted immediately before and 1 bit of channel data $a_i$ outputted immediately before. In other words, 3 bits of output data are constrained not only to 2 bits of current input data but also to 2 bits of past input data and 1 bit of output data. Accordingly, codes to be subjected to RLL(1, 7) modulation can be regarded as trellis codes.

Figure 5:
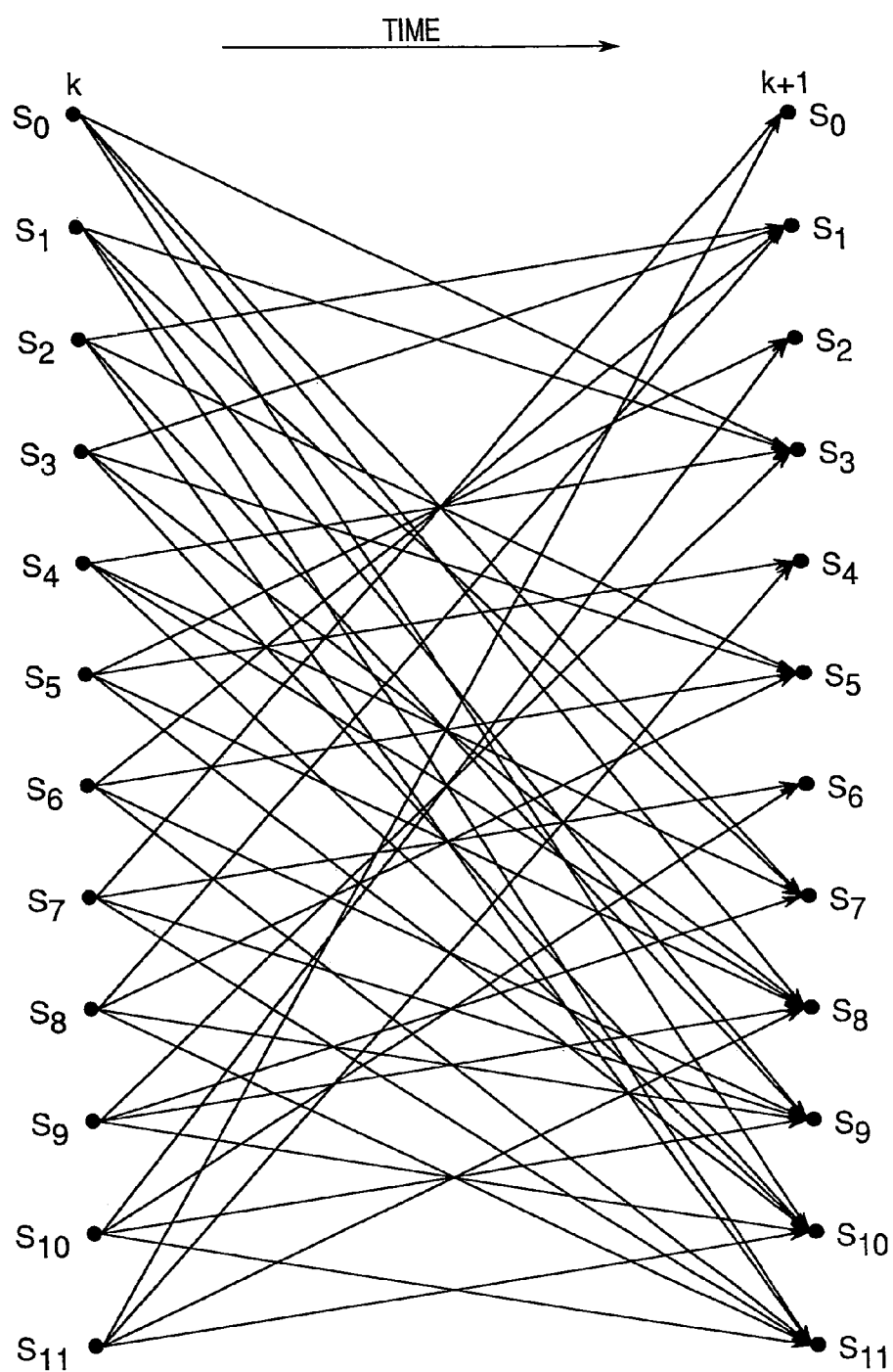
FIG. 5 shows an example of a trellis diagram corresponding to the RLL(1, 7) conversion table shown in FIG. 3.

FIG. 5 is a trellis diagram for a case where codes to be subjected to the RLL(1, 7) modulation are regarded as trellis codes. This trellis diagram has twelve kinds of internal states, $S_0$-$S_{11}$, In this case, point "k" represents a time on a basis of every 2 bits of pre-modulation code data $c_i$. That is, at every advance of point "k" by one, 2 bits of code data $c_i$ are modulated and 3 bits of channel data $a_i$ are outputted.

FIGS. 6A and 6B show correspondence tables, based on the trellis diagram shown in FIG. 5, defining the correspondence among the current state, input (pre-modulation data $c_i$), output (post-modulation data $a_i$) and the following state. The input in these tables corresponds to the "succeeding input bits" in the modulation table shown in FIG. 3. The output corresponds to the channel data $a_i$ based on the NRZ rules which are NRZ-converted from the "channel-bit RLL (1, 7)" in the modulation table shown in FIG. 3. For example, with the internal state being $S_{11}$ at point "k," if the input 2 bits are (1,1), then the output 3 bits are (0, 0, 0), resulting in an internal state of $S_{10}$ at the succeeding point (k+1). Thus, the trellis diagram corresponds to constraints representing correspondence between code data before being subjected to the RLL modulation and channel data to be obtained after having passed through the channel. The correspondence tables shown in FIGS. 6A and 6B based on this trellis diagram correspond to constraints concerning RLL modulation.

FIGS. 7A and 7B are correspondence tables defining the correspondence among the current state, input (pre-modulation data $c_i$), output (channel data resulting from adding a PR transfer characteristic to channel data $a_i$ based on the NRZ rules) and the following state, where the PR transfer characteristic is (1, 2, 1). The trellis diagram equivalent to these correspondence tables has 12 kinds of internal states, $S_0$-$S_{11}$. A trellis diagram corresponding to the PR transfer characteristic (1, 2, 1) is the same as the trellis diagram for RLL(1, 7) shown in FIG. 5. However, input values and output values corresponding to individual branches are as shown in FIGS. 7A and 7B, which are different from those of FIGS. 6A and 6B that apply to the RLL(1, 7) modulation. It is noted that the correspondence tables shown in FIGS. 7A and 7B satisfy both constraints concerning the RLL modulation and constraints concerning the PR transfer characteristic (1, 2, 1).

Generally, trellis diagrams differ depending on the PR transfer characteristic. However, some PR transfer characteristics may result in an identical arrangement of branches from the states of a current point to the states of a next point as shown in FIG. 5. Nevertheless, input values and output values of the individual branches differ depending on the PR transfer characteristic, and never coincide.

A reproduced signal $y_i$ for the PR transfer characteristic (1, 2, 1) is $$y_i = a_i + 2 \cdot a_{i-1} + a_{i-2} \qquad (2)$$

From the constraints concerning the minimum run length limit (d=1), the reproduced signal $y_i$ takes one of four values, 0, 1, 3 and 4. Accordingly, for example, with the internal state being $S_{11}$ at point "k," if the 2-bit input values are (1,1), then the 3-bit output values are (3, 1, 0), resulting in an internal state of $S_{10}$ at the succeeding point (k+1).

As shown above, in the recording-medium reproducing apparatus shown in FIG. 2, the code data $c_i$ is subjected to RLL modulation by the RLL modulator 33, thus transformed into channel data $a_i$ based on the NRZ rules and recorded on the recording medium 35. Besides, the recording circuit 34, the recording medium 35 and the reproduction circuit 41 constitute a PR transfer characteristic. In such a case, the reproduced signal $y_i$ reproduced by the reproduction circuit 41 of the recording-medium reproducing apparatus shown in FIG. 1 can be said to be a reproduced signal of a signal resulting from transforming the code data $c_i$ into the channel data $z_i$ based on the NRZ rules according to the conversion tables shown in FIGS. 7A and 7B.

Therefore, in this recording-medium reproducing apparatus, conversion tables shown in FIGS. 7A and 7B based on the trellis diagram are previously stored in a ROM 43a or the like as the trellis diagram information. Then, the first APP decoder 43 performs the APP decoding according to the conversion tables. It is noted that the PR transfer characteristic is not limited to (1, 2, 1), and the present embodiment is applicable with any PR transfer characteristic. What is needed is to create a trellis diagram according to the PR transfer characteristic and perform the APP decoding according to the created trellis diagram.

Next, contents of computations by the logarithmic-likelihood computing circuit 42 will be explained in detail. Here, the contents of calculations by the logarithmic-likelihood computing circuit 42 will be explained by taking an example of a PR transfer characteristic (1, 2, 1). Generally, this computation is carried out on the assumption that the channel is a simple noise-addition source. That is, a pre-demodulation reproduced signal $y'_i$ is defined by Equation (3):

$$y'_i = y_i + n_1 \qquad (3)$$

where $y_i$ is an ideal reproduced signal that is not affected by the channel, and $n_i$ is noise, where the term "ideal" means that the signal, when passing the channel, which is the recording medium 35, never undergoes any deformation such as noise, band limiting, crosstalk or jitter. Therefore, ideal reproduced signals $y_i$ can be regarded as a signal sequence transmitted to a noise-adding channel. It is noted that $n_i$ represents error components added to the ideal reproduced signal $y_i$. Then, the logarithmic likelihood $L(y'_i|y_i)$ of the pre-demodulation reproduced signal $y'_i$ is defined as follows:

$$L(y'_i|y_i) = \ln [P(y'_i|y_i)] \qquad (4)$$

where $P(y'_i|y_i)$ is a conditional probability of reception of the reproduced signal $y'_i$ in transmission of a signal sequence $y_i$.

In this case, assuming that the channel is a white Gaussian channel, the probability density at which $y'_i$ is received in the case of transmission of $y_i$ can be expressed as:

$$P(y'_i | y_i) = \frac{1}{\sigma_n \sqrt{2\pi}} \cdot \exp\left[-\frac{(y'_i - y_i)^2}{2\sigma_n^2}\right] \qquad (5)$$

where $\sigma_n$ is an effective amplitude (standard deviation) of the noise, and exp represents an exponential function.

As described before, the reproduced signal $y_i$ takes one of the four values, 0, 1, 3 and 4. Therefore, from Equations (4) and (5), the logarithmic-likelihood computing circuit 42 may well compute four logarithmic likelihoods $L(y'_i|y_i)$ according to Equation (6):

$$L(y'_i|y_i) = (1/2\sigma_n^2)(2y_i y'_i - y_i^2) + \text{Const}_i \qquad (6)$$

where $\text{Const}_i$, which is a constant value in four logarithmic likelihoods $L(y'_i|y_i)$, is determined so that a total of conditional probabilities $P(y'_i|y_i)$ at which four reproduced signals $y_i$ are received becomes 1. However, since computation is performed in the first APP decoder 43 so as to offset or cancel the constant $\text{Const}_i$, computation results of the first APP decoder 43 remain unchanged even under the condition that constant $\text{Const}_i = 0$. Accordingly, with constant $\text{Const}_i = 0$, four logarithmic likelihoods $L(y'_i|y_i)$ can be specifically expressed as shown in Equation (7):

$$L(y'_i|y_i=+4) = (1/\sigma_n^2)(4y'_i - 8)$$

$$L(y'_i|y_i=+3) = (1/2\sigma_n^2)(6y'_i - 9)$$

$$L(y'_i|y_i=+1) = (1/2\sigma_n^2)(2y'_i - 1)$$

$$L(y'_i|y_i=0) = 0 \qquad (7)$$

The logarithmic-likelihood computing circuit 42 has only to compute these four possible logarithmic likelihoods $L(y'_i|y_i)$ As shown above, in the recording-medium reproducing apparatus of this embodiment, at the preceding stage of the first one 43 of the two APP decoders that perform the turbo decoding is provided the logarithmic-likelihood computing circuit 42 that creates and outputs logarithmic likelihoods $L(y'_i|y_i)$ of a pre-demodulation reproduced signal $y'_i$. Further, the first APP decoder 43 has an APP decoding function of receiving inputs of logarithmic likelihoods $L(y'_i|y_i)$ of the reproduced signal $y_i$ as well as a priori information as to the code data $c'_i$, updating the code data $c'_i$ and producing outputs of a posteriori probabilities according to trellis diagram information (e.g., the conversion tables shown in FIGS. 7A and 7B) that satisfy both the constraints concerning RLL modulation stored in the ROM and the constraints concerning PR transfer characteristics.

Accordingly, an RLL demodulation based on soft information is enabled so that turbo decoding can be applied to the RLL demodulation. Thus, information data can be reconstructed with high error-correcting capability from a recording medium on which channel data $a_i$ obtained by subjecting the information data $u_i$ to convolutional coding and RLL modulation has been recorded as in the recording-medium recording apparatus shown in FIG. 2. That is, according to this embodiment, recording density of the recording medium can be enhanced. Further, tolerances for recording media and tolerances for the recording-medium reproducing apparatus are allowed to be larger.

In this embodiment, the first subtracter 44 is disposed on the input side of the deinterleaver 45. However, the first subtracter 44 may also be disposed on the output side of the deinterleaver 45 (hereinafter, this arrangement will be referred to as the second arrangement). That is, an a posteriori probability $L(c'_i;O)$ of the code data $c'_i$ outputted from the information output terminal u;O of the first APP decoder 43 is inputted directly to the deinterleaver 45. Then, an output of the deinterleaver 45 (i.e., a logarithmic-likelihood ratio $L(e'_i;O_2)$ of the code data $e'_i$ subjected to deinterleaving of the pseudo-random interleaving) is inputted to the first subtracter 44. Then, the first subtracter 44 subtracts extrinsic information $Lext(e'_i;O_2)$ associated with the code data $e'_i$, which is an output of the second subtracter 48, from the logarithmic-likelihood ratio $L(e'_i;O_2)$ of the code data $e'_i$ subjected to deinterleaving of the pseudo-random interleaving. Then, an output of the first subtracter 44 is inputted to the code input terminal c;I of the second APP decoder 46.

In the case of the first arrangement shown in FIG. 1, the first subtracter 44 performs subtraction between code data after pseudo-random interleaving (i.e., before the deinterleaving of the pseudo-random interleaving). In the. case of the second arrangement, by contrast, subtraction between code data before the pseudo-random interleaving (i.e., after the deinterleaving of the pseudo-random interleaving) is performed. Accordingly, the first arrangement and the second arrangement are absolutely identical to each other in computation results.

Similarly, the second subtracter 48 may also be disposed after the pseudo-random interleaving by the inter leaver 49 (i.e., before the deinterleaving of the pseudo-random interleaving) (hereinafter, this arrangement will be referred to as the third arrangement). That is, an a posteriori probability $L(e'_i;O)$ of the code data $e'_i$ outputted from the code output terminal c;O of the second APP decoder 46 is inputted directly to the interleaver 49. Then, an output of the interleaver 49 (i.e., a logarithmic-likelihood ratio $L(c'_i;O_2)$ of code data $c'_i$ subjected to the pseudo-random interleaving) is inputted to the second subtracter 48. The second subtracter 48 in turn subtracts the extrinsic information $Lext(c'_i)$ associated with the code data $c'_i$, which is an output of the first subtracter 44, from the logarithmic-likelihood ratio $L(c'_i;O_2)$ of the code data $c'_i$ subjected to the pseudo-random interleaving. Then, an output of the second subtracter 48 is inputted to the information input terminal u;I of the first APP decoder 43.

It is noted that in this third arrangement, subtraction between code data after the pseudo-random interleaving (i.e., before deinterleaving of the pseudo-random interleaving) is performed. Accordingly, the first arrangement and the third arrangement are absolutely identical to each other in computation results.

As shown above, in this embodiment, the subtracters 44, 48 may be disposed either before the pseudo-random interleaving (i.e., after the deinterleaving of pseudo-random interleaving) or after the pseudo-random interleaving (i.e., before the deinterleaving of pseudo-random interleaving). That is, the subtracters have only to be appropriately disposed-so that their computation results become absolutely the same in each case.

Second Embodiment

Figure 8:
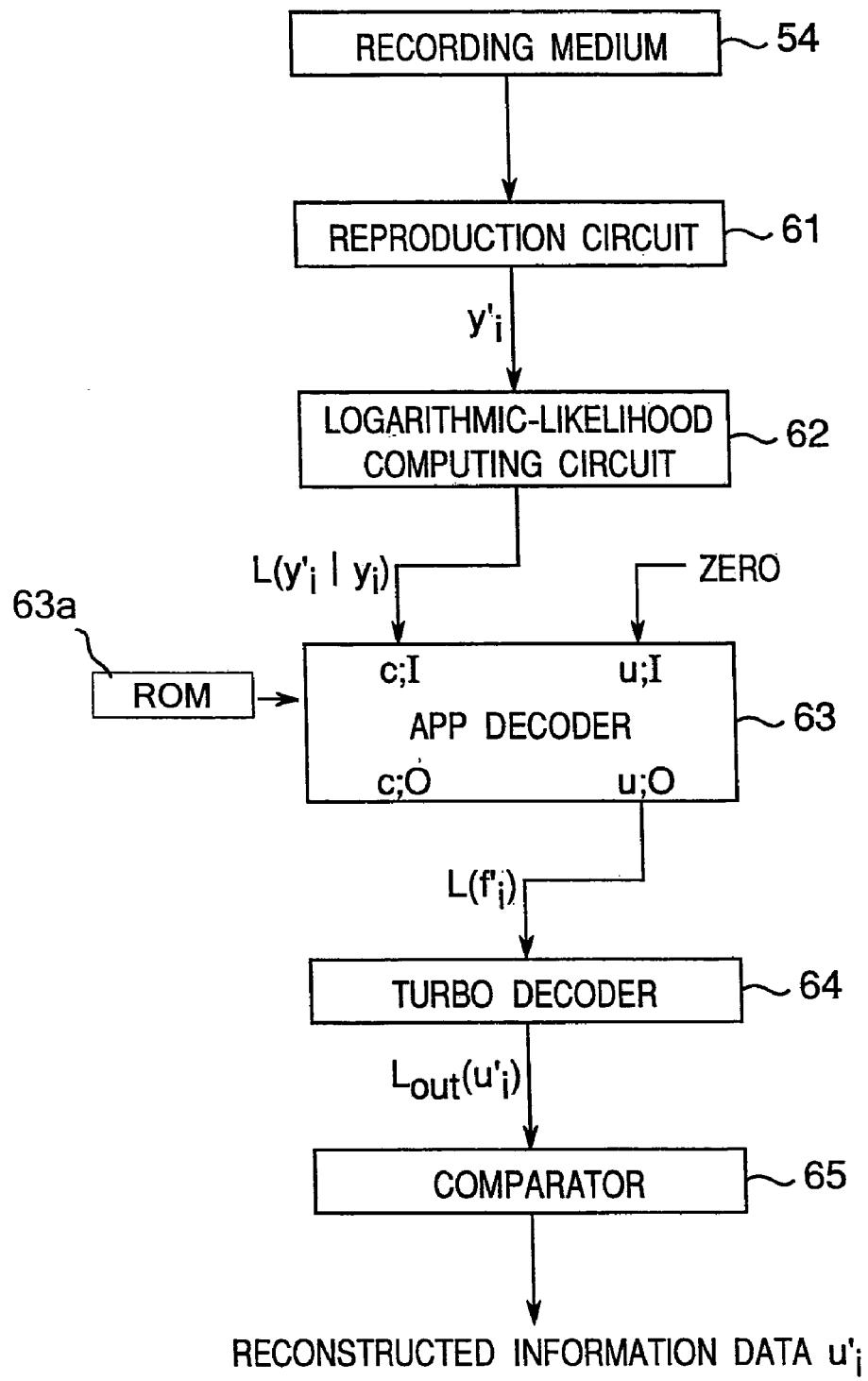
FIG. 8 is a block diagram of a recording-medium reproducing apparatus in a second embodiment of the invention.
Figure 9:
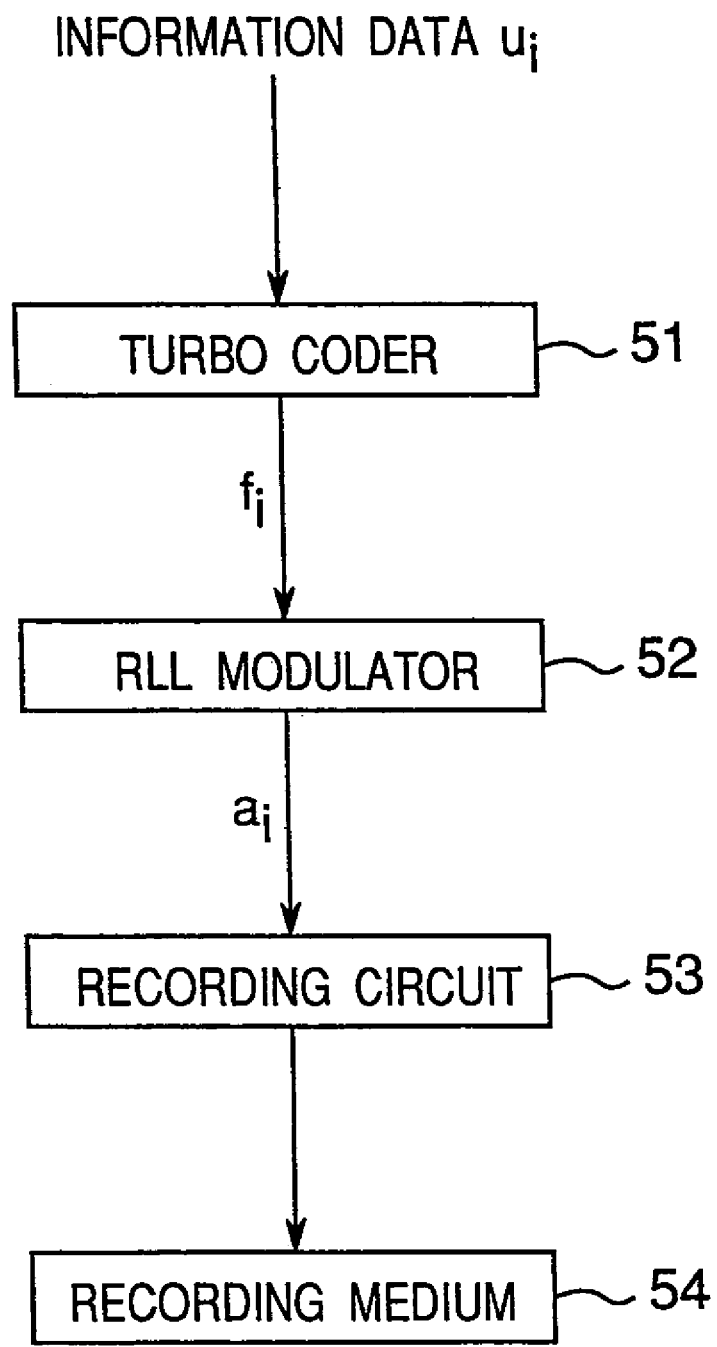
FIG. 9 is a block diagram of a recording-medium recording apparatus for recording data which is reproduced by the recording-medium reproducing apparatus shown in FIG. 8, 12, 17 or 18.

FIG. 8 is a block diagram of a recording-medium reproducing apparatus in a second embodiment. FIG. 9 is a block diagram of a recording-medium recording apparatus for recording, on a recording medium, channel data $a_i$ which is reproduced by the recording-medium reproducing apparatus shown in FIG. 8. First, the recording-medium recording apparatus will be explained.

In the recording-medium recording apparatus shown in FIG. 9, a turbo coder 51 performs turbo coding on inputted information data $u_i$, and outputs code data $f_i$. Details of the turbo coder 51 will be described later. An RLL modulator 52 performs RLL modulation on the inputted code data $f_i$, and outputs channel data $a_i$. The channel data $a_i$ outputted in this way are recorded on a recording medium 54 by a recording circuit 53. The recording circuit 53 implements a magnetic recording, magneto-optical recording, optical recording or the like. Thus, this recording-medium recording apparatus performs both turbo coding and RLL modulation.

Next, the recording-medium reproducing apparatus shown in FIG. 8 will be explained. A reproduction circuit 61 and a logarithmic-likelihood computing circuit 62 are the same as the reproduction circuit 41 and the logarithmic-likelihood computing circuit 42, respectively, of the recording-medium reproducing apparatus shown in FIG. 1 in the first embodiment, and so a detailed description on them is omitted. A logarithmic likelihood $L(y'_i|y_i)$ outputted from the logarithmic-likelihood computing circuit 62 serving as the probability computing means is inputted to the code input terminal c; I of an APP decoder 63. Further, a zero is inputted at all times to the information input terminal u;I of the APP decoder 63. That is, the APP decoder 63 performs the a posteriori probability (APP) decoding under the condition that a priori information $L_a$ ($f'_i$) is absent. Then, the APP decoder 63 outputs an a posteriori probability $L(f'_i)$ of the code data $f'_i$ from the information output terminal u;O.

Also in this recording-medium reproducing apparatus as well, the conversion tables shown in FIGS. 7A and 7B based on the trellis diagram are previously stored in a ROM 63a or the like. Then, the APP decoder 63 performs APP decoding in compliance with constraints concerning RLL modulation according to the conversion tables as well as constraints concerning the PR transfer characteristic (1, 2, 1). As a result, a soft-input and soft-output RLL demodulation becomes available, thus being usable in combination with a succeeding-stage turbo decoder 64. It is noted that the PR transfer characteristic is not limited to (1, 2, 1). The present embodiment is usable for any PR transfer characteristic only by preparatorily creating a trellis diagram according to the PR transfer characteristic used.

The turbo decoder 64, receiving a logarithmic-likelihood ratio $L(f'_i)$ of code data $f'_i$ from the APP decoder 63, produces an output of an APP decoding result $L_{out}(u'_i)$ of information data. In this case, the turbo decoder 64 performs a decoding corresponding to the coding performed by the turbo coder 51 of the recording-medium recording apparatus shown in FIG. 9. Details of the turbo decoder 64 will be described later. A comparator 65 binarizes the APP decoding result $L_{out}(u'_i)$ inputted from the turbo decoder 64, and outputs reconstructed information data $u'_i$.

Figure 10:
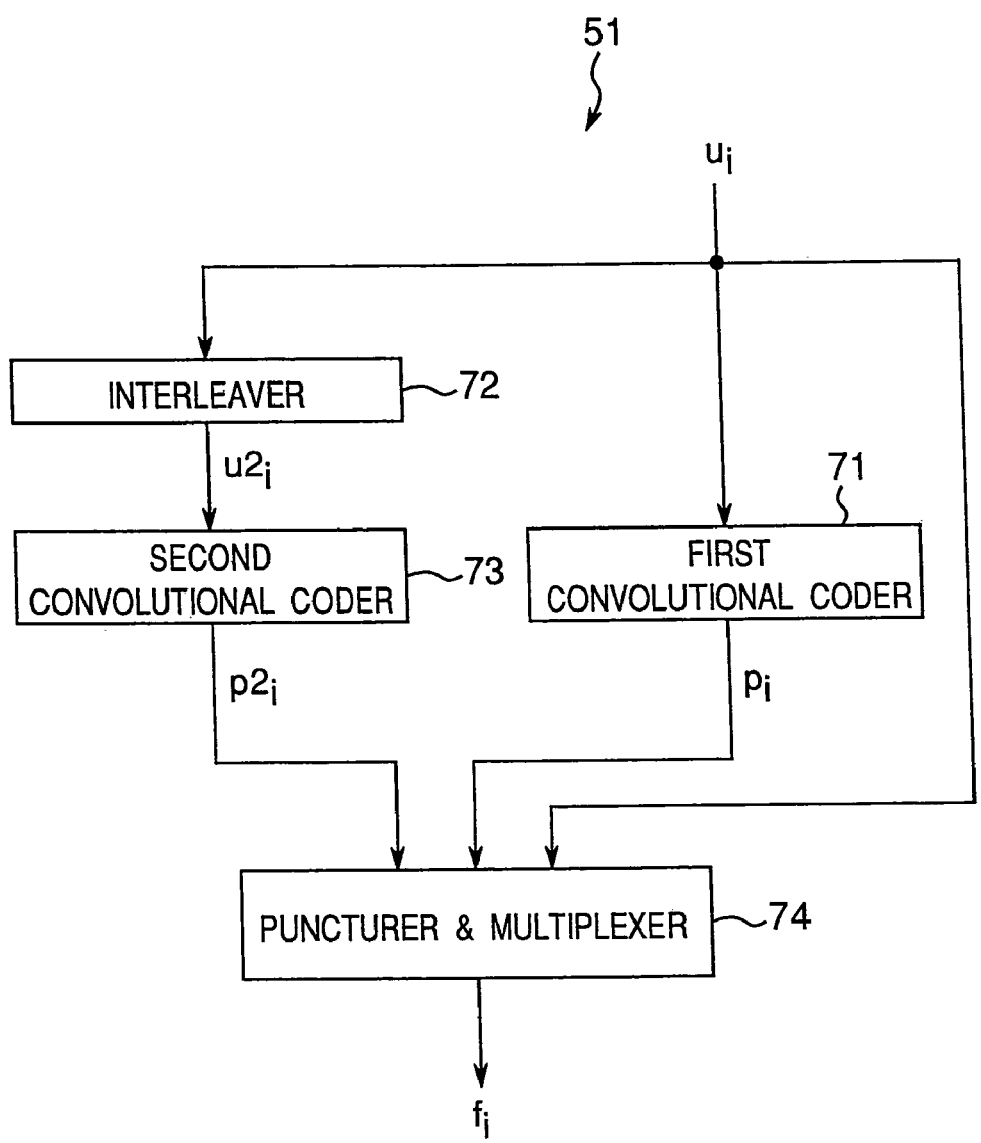
FIG. 10 is a block diagram of a turbo coder in FIG. 9.

FIG. 10 is a block diagram showing details of the turbo coder 51 in FIG. 9. A first convolutional coder 71 and a second convolutional coder 73 in FIG. 10 create output data in which input data is contained as it is. Such a coding is called systematic coding, and output data other than the contained input data (i.e., redundancies due to coding) is called parity bits. That is, the first convolutional coder 71 performs convolutional coding on inputted information data $u_i$, and outputs a parity bit $p_i$. An interleaver 72 performs pseudo-random interleaving on the information data $u_i$, and outputs post-interleaving information data $u2_i$. Also, the second convolutional coder 73 performs convolutional coding on the inputted post-interleaving information data $u2_i$, and outputs a parity bit $p2_i$.

A puncturer-and-multiplexer 74 receives inputs of the information data $u_i$, the parity bits $p_i$ derived from the first convolutional coder 71 and the parity bits $p2_i$ derived from the second convolutional coder 73. Then, the inputted parity bits $p_i$ and the parity bits $p2_i$ are partly punctured (deleted) so that a specified coding rate results. Further, the remaining parity bits $p_i$ and parity bits $p2_i$ that have not been punctured and the information data $u_i$ are united by the multiplexer function, resulting in serial data, which are outputted as code data $f_i$.

The turbo coder 51 shown in FIG. 10 is a turbo coder composed of two convolutional coders for the so-called parallel concatenated convolutional codes (hereinafter, referred to as PCCC) system.

Figure 11:
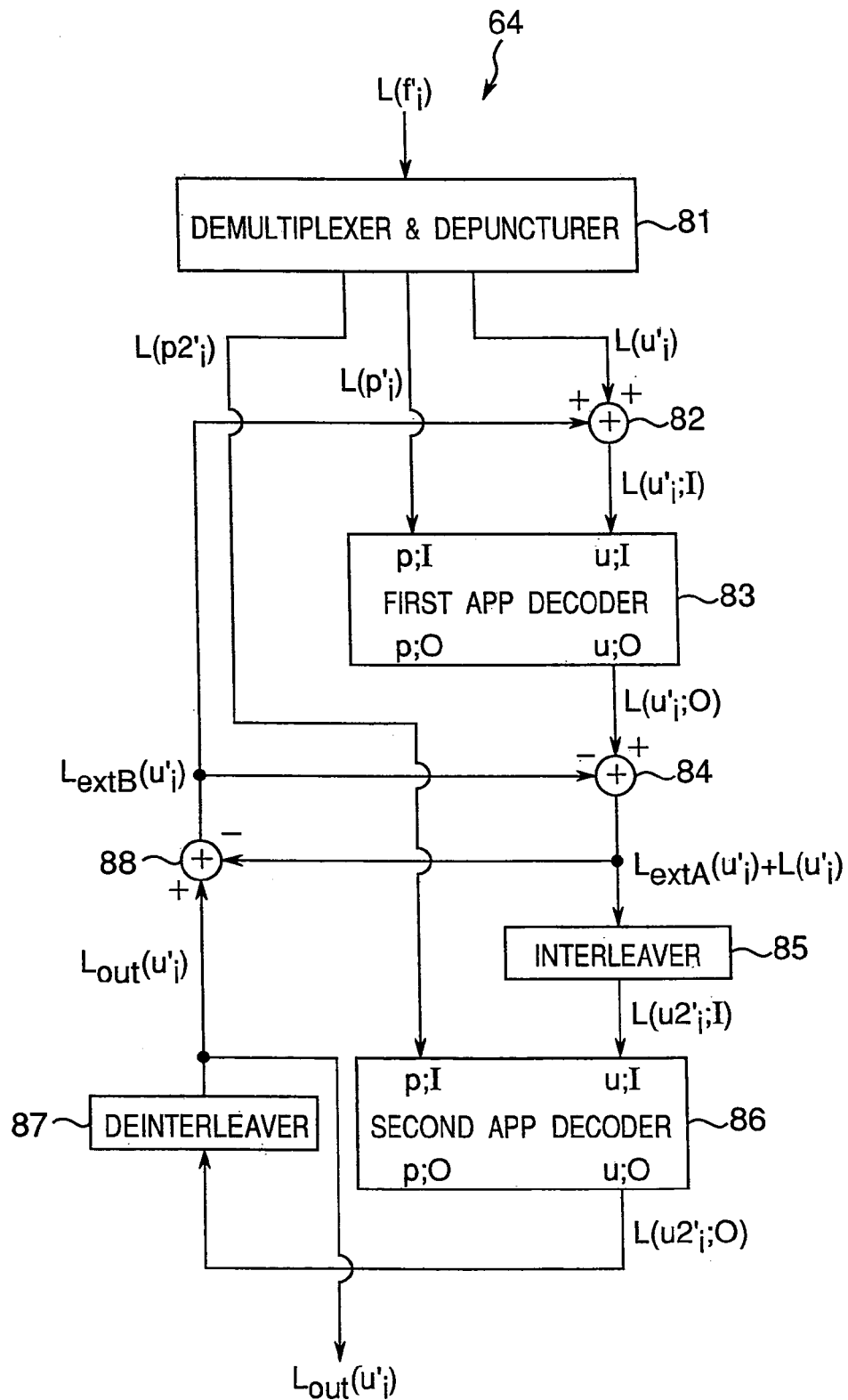
FIG. 11 is a block diagram of a turbo decoder in FIG. 8.

FIG. 11 is a block diagram showing details of the turbo decoder 64 in FIG. 8. The turbo decoder 64 shown in FIG. 11 performs a decoding corresponding to the coding performed by the turbo coder 51 shown in FIG. 10.

Referring to FIG. 11, a demultiplexer-and-depuncturer 81 decomposes the logarithmic-likelihood ratio $L(f'_i)$ of the code data $f'_i$ inputted from the APP decoder 63 by its demultiplexer function to divide the data into a logarithmic-likelihood ratio $L(u'_i)$ of the information data $u'_i$, a logarithmic-likelihood ratio $L(p'_i)$ of the parity $p'_i$, and a logarithmic-likelihood ratio $L(p2'_i)$ of the parity $p2'_i$. Simultaneously with this, the logarithmic-likelihood ratio of the parity bit punctured in the coding is added (depunctured) as a value of zero. Then, the logarithmic-likelihood ratio $L(u'_i)$ of the information data $u'_i$ is inputted to an adder 82. The logarithmic-likelihood ratio $L(p'_i)$ of the parity data $p'_i$ is inputted to a parity input terminal p;I of a first APP decoder 83. Further, the logarithmic-likelihood ratio $L(p2'_i)$ of the parity data $p2'_i$ is inputted to a parity input terminal p;I of a second APP decoder 86.

The adder 82 adds up the logarithmic-likelihood ratio $L(u'_i)$ of the information data $u'_i$ and extrinsic information $L_{extB}(u'_i)$ of the information data $u'_i$ outputted from a later-described second subtracter 88, and outputs a logarithmic-likelihood ratio $L(u'_i;I)$. That is, $$L(u'_i;I)=L_{extB}(u'_i)+L(u'_i) \qquad (8)$$

where $L_{extB}(u'_i)$ is extrinsic information created by the second APP decoder 86 as described later.

In the first APP decoder 83, an output $L(u'_i;I)$ of the adder 82 is inputted to the information input terminal u;I, while an output $L(p'_i)$ of the demultiplexer-and-depuncturer 81 is inputted to the parity input terminal p;I, where the first APP decoder 83 performs a decoding corresponding to the coding performed by the first convolutional coder 71 of FIG. 10. It is noted that the first APP decoder 83 utilizes as a priori information the extrinsic information $L_{extB}(u'_i)$ out of the $L(u'_i;I)$ shown in Equation (8). This can be reexpressed as shown in Equation (9):

$$L(u'_i;I)=L_{aA}(u'_i)+L(u'_i) \qquad (9)$$

where $L_{aA}(u'_i)$ is a priori information inputted to the first APP decoder 83 and used for decoding. In this way, the first APP decoder 83 carries out APP decoding in compliance with constraints based on the information data $u_i$ and the parity bits $p_i$. Then, the first APP decoder 83 outputs a logarithmic-likelihood ratio $L(u'_i;O)$ of the information data $u'_i$ from the information output terminal u;O. In this case, the difference between the logarithmic-likelihood ratios of the information data $u'_i$ before and after updating by the first APP decoder 83 (i.e., a difference resulting from subtracting $L(u'_i;I)$ from $L(u'_i;O)$) is extrinsic information $L_{extA}(u'_i)$ created by the first APP decoder 83. Therefore, from Equations (8) and (9), a relation defined by the following Equation (10) holds:

$$\begin{aligned} L(u'_i;O) &= L_{extA}(u'_i)+L(u'_i;I) \\ &= L_{extA}(u'_i)+L_{extB}(u'_i)+L(u'_i) \\ &= L_{extA}(u'_i)+L_{aA}(u'_i)+L(u'_i) \end{aligned} \qquad (10)$$

It is noted that a parity output terminal p;O, from which an a posteriori probability $L(p'_i;O)$ of parity data p' is outputted, is connected to none.

A first subtracter 84 and an interleaver 85 operate immediately after the a posteriori probability $L(u'_i;O)$ of the information data $u'_i$ is outputted from the first APP decoder 83. Then, the first subtracter 84 subtracts extrinsic information $L_{extB}(u'_i)$ as to the information data $u_i$ inputted from the second subtracter 88, from the a posteriori probability $L(u'_i;O)$ inputted from the first APP decoder 83, and outputs $L_{extA}(u'_i)+L(u'_i)$. Also, the interleaver 85 performs an deinterleaving of the aforementioned pseudo-random interleaving on the $L_{ext}(u'_i)+L(u'_i)$ inputted from the first subtracter 84, and outputs a logarithmic-likelihood ratio $L(u2'_i;I)$ of post-interleaving information data. That is, it holds that $$L(u2'_i;I)=L_{extA}(u2'_i)+L(u2'_i) \qquad (11)$$

Here, u2 is defined as post-interleaving information data. That is, information data u is interleaved to become information data u2, and the information data u2 is deinterleaved to become information data u.

The logarithmic-likelihood ratio $L_{extA}(U2'_i)$ in Equation (11), which is obtained by interleaving the extrinsic information $L_{extA}(u'_i)$ associated with the information data $u'_i$ updated by the first APP decoder 83, is inputted to the second APP decoder 86 as a priori information as to the information data $u2'_i$. This can be reexpressed as shown in Equation (12):

$$L(u2'_i;I)=L_{aB}(u2'_i)+L(u2'_i) \qquad (12)$$

where $L_{aB}(u2'_i)$ is a priori information which is to be inputted to the second APP decoder 86 and used for decoding.

In the second APP decoder 86, the logarithmic-likelihood ratio $L(u2'_i;I)$ of the information data $u2'_i$ derived from the interleaver 85 is inputted to the information input terminal u;I, while the logarithmic-likelihood ratio $L(p2'_i)$ of the parity data $p2'_i$ derived from the demultiplexer-and-depuncturer 81 is inputted to the parity input terminal p;I. Then, the second APP decoder 86 performs a decoding corresponding to the coding performed by the second convolutional coder 73 of FIG. 10. That is, the second APP decoder 86 performs APP decoding in compliance with constraints based on the information data $u2_i$ and the parity bit $p2_i$. Thus, the second APP decoder 86 outputs an a posteriori probability $L(u2'_i;O)$ of the information data $u2'_i$ from the information output terminal u;O. The difference between the logarithmic-likelihood ratios of the information data $u2'_i$ before and after updating by the second APP decoder 86 (i.e., a difference resulting from subtracting $L(u2'_i;I)$ from $L(u2'_i;O)$) is extrinsic information $L_{extB}(u2'_i)$ created by the second APP decoder 86. Therefore, from Equations (11) and (12), a relation of the following Equation (13) holds:

$$L(u2'_i; O) = L_{extB}(u2'_i) + L(u2'_i; I) \quad (13)$$
$$= L_{extB}(u2'_i) + L_{extA}(u2'_i) + L(u2'_i)$$
$$= L_{extB}(u2'_i) + L_{aB}(u2'_i) + L(u2'_i)$$

It is noted that the parity output terminal p;O, from which an a posteriori probability $L(p'_i;O)$ of parity data p' is outputted, is connected to none.

A deinterleaver 87 and a second subtracter 88 operate immediately after the a posteriori probability $L(u2'i;O)$ of the information data $u2'_i$ is outputted from the second APP decoder 86. Then, the deinterleaver 87 performs deinterleaving of the pseudo-random interleaving on the inputted a posteriori probability $L(u2'_i;O)$, and outputs a logarithmic-likelihood ratio $L_{out}(u'_i)$ of post-deinterleaving (i.e., pre-interleaving) information data $u'_i$. That is, from Equation (13), it holds that $$L_{out}(u'_i) = L_{extB}(u'_i) + L_{extA}(u'_i) + L(u'_i) \quad (14)$$

where $L_{extB}(u'_i)$ is a result of deinterleaving the extrinsic information $L_{extB}(u2'_i)$ updated by the second APP decoder 86. Also, $L_{extA}(u'_i)$ is extrinsic information updated by the first APP decoder 83. Then, the logarithmic-likelihood ratio $L_{out}(u'_i)$ of the information data $u'_i$ outputted from the deinterleaver 87 is outputted as a decoding result of this turbo decoder 64.

The second subtracter 88 subtracts $L_{extA}(u'_i)+L(u'_i)$, which is inputted from the first subtracter 84, from the logarithmic-likelihood ratio $L_{out}(u'_i)$, which is inputted from the deinterleaver 87, and outputs $L_{extB}(u'_i)$ This logarithmic-likelihood ratio $L_{extB}(u'_i)$ of the information data $u'_i$ is inputted to the adder 82 as described before.

In this way, turbo decoding is performed by repeatedly delivering logarithmic-likelihood ratios of information data between the first APP decoder 83 and the second APP decoder 86, allowing the reconstructed information data $u'_i$ to be reduced in errors. In this case, at the first iteration of decoding, the extrinsic information $L_{extB}(u'_i)$ (i.e., a priori information $L_{aA}(u'_i)$), which is inputted from the second subtracter 88 to the adder 82, is set to zero.

As shown above, in the second embodiment, with the turbo coder 51 and the RLL modulator 52 incorporated in the recording-medium recording apparatus, channel data $a_i$ that has been subjected to both turbo coding and RLL modulation is recorded on the recording medium 54. Meanwhile, with the turbo decoder 64 incorporated in the recording-medium reproducing apparatus, turbo decoding is performed. As a result, as compared with the first embodiment, information data can be reconstructed with higher error-correcting capability, so that the recording density onto the recording medium can be enhanced. Further, tolerances for recording media and tolerances for the recording-medium reproducing apparatus are allowed to be larger or less strict.

In this embodiment, in the recording-medium reproducing apparatus, at the preceding stage of the turbo decoder 64 are disposed the logarithmic-likelihood computing circuit 62 and the APP decoder 63 having the same functions as the logarithmic-likelihood computing circuit 42 and the first APP decoder 43, respectively, shown in FIG. 1 in the first embodiment. Accordingly, the APP decoder 63 has an APP decoding function of receiving inputs of logarithmic likelihoods $L(y'_i|y_i)$ of a reproduced signal $y'_i$ derived from the logarithmic-likelihood computing circuit 62, and updating the code data $f_1$ and outputs a posteriori probabilities according to trellis diagram information (e.g., conversion tables shown in FIGS. 7A and 7B) which is stored in the ROM 63a and which satisfies both constraints concerning the RLL modulation and constraints concerning the PR transfer characteristic. Thus, the RLL demodulation based on soft information is enabled so that turbo decoding becomes applicable to the RLL demodulation.

In the second embodiment, as described above, the first APP decoding means is implemented by the APP decoder 63 in FIG. 8. Further, the second APP decoding means is implemented by the first APP decoder 83 and the second APP decoder 86 in FIG. 11.

Third Embodiment

Figure 12:
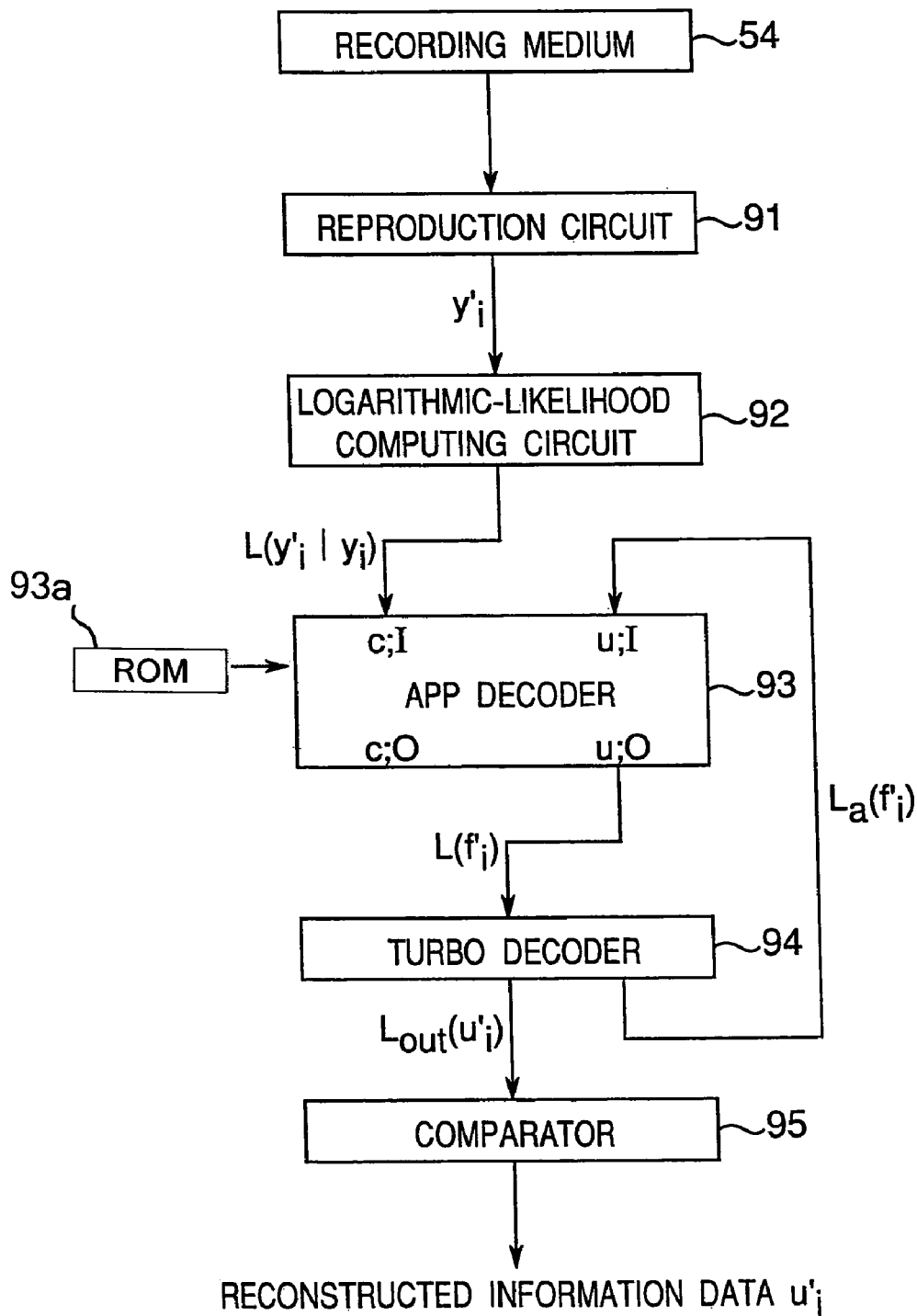
FIG. 12 is a block diagram of a recording-medium reproducing apparatus in a third embodiment of the invention.

FIG. 12 is a block diagram of a recording-medium reproducing apparatus in a third embodiment. This recording-medium reproducing apparatus serves for reproduction from a recording medium 54 on which channel data $a_i$ has been recorded by the recording-medium recording apparatus shown in FIG. 9.

A reproduction circuit 91 and a logarithmic-likelihood computing circuit 92 are the same as the reproduction circuit 41 and the logarithmic-likelihood computing circuit 42, respectively, of the recording-medium reproducing apparatus shown in FIG. 1 in the first embodiment. A comparator 95 is the same as the comparator 65 of the recording-medium reproducing apparatus shown in FIG. 8 in the second embodiment. Therefore, a detailed description of those components is omitted. A logarithmic likelihood $L(y'_i|y_i)$ outputted from the logarithmic-likelihood computing circuit 92 serving as the probability computing means is inputted to the code input terminal c;I of an APP decoder 93. Further, a priori information $L_a(f_i)$ as to code data $f_i$ outputted from a turbo decoder 94 is inputted to the information input terminal u;I of the APP decoder 93. That is, the APP decoder 93 performs APP decoding based on the a priori information $L_a(f_i)$ as to the code data $f_i$ and the logarithmic likelihood $L(y'_i|y_i)$ of the reproduced signal $y'_i$, and outputs an a posteriori probability $L(f_i)$ of the code data $f_i$ from the information output terminal u;O.

In this recording-medium reproducing apparatus also, the conversion tables shown in FIGS. 7A and 7B based on the trellis diagram are preparatorily stored in a ROM or the like. Then, the APP decoder 93 performs the APP decoding in compliance with constraints concerning the RLL modulation and constraints concerning the PR transfer characteristic (1, 2, 1) according to the conversion tables. As a result of this, an RLL demodulation with an input of soft information and an output of soft information is enabled, allowing the succeeding-stage turbo decoder 94 to be used in combination with the APP decoder 93. It is noted that the PR transfer characteristic is not limited to (1, 2, 1), and any required PR transfer characteristic is applicable in this embodiment only by preparing a trellis diagram according to the PR transfer characteristic used.

Receiving an a posteriori probability $L(f_i)$ of code data $f_i$ from the APP decoder 93, the turbo decoder 94 performs the decoding and outputs an APP decoding result $L_{out}(u'_i)$ of the information data and a priori information $L_a(f_i)$ as to the code data. In this case, the turbo decoder 94 performs a decoding corresponding to the coding performed by the turbo coder 51 in the recording-medium recording apparatus shown in FIG. 9. Details of the turbo decoder 94 will be described later.

As described above, iterative decodings are performed by repeatedly delivering logarithmic-likelihood ratios of code data $f'_i$ between the APP decoder 93 and the APP decoder 94, allowing errors in the reconstructed information data $u'_i$ to be reduced. In this case, in the first iteration of a decoding operation, the a priori information $L_a(f'_i)$, which is inputted to the information input terminal u;I of the APP decoder 93, is set to zero.

Figure 13:
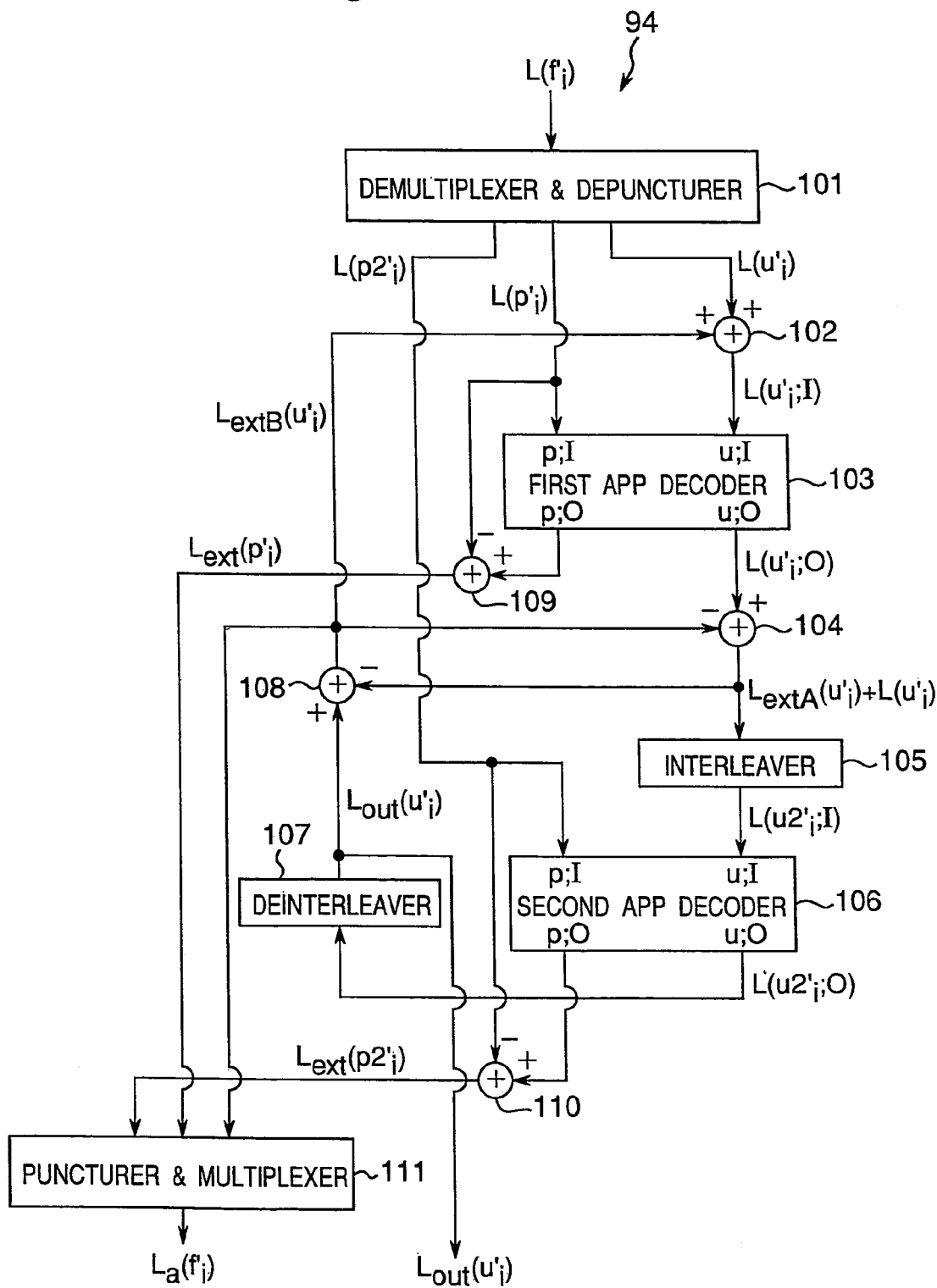
FIG. 13 is a block diagram of a turbo decoder in FIG. 12.

FIG. 13 is a block diagram showing details of a turbo decoder 94 in FIG. 12. In this case, a demultiplexer-and-depuncturer 101, an adder 102, a first APP decoder 103, a first subtracter 104, an interleaver 105, a second APP decoder 106, a deinterleaver 107 and a second subtracter 108 are similar to the demultiplexer-and-depuncturer 81, the adder 82, the first APP decoder 83, the first subtracter 84, the interleaver 85, the second APP decoder 86, the deinterleaver 87 and the second subtracter 88, respectively, in the turbo decoder 64 shown in FIG. 11 in the second embodiment.

A third subtracter 109 subtracts the logarithmic-likelihood ratio $L(p'_i)$ of the parity $p'_i$ outputted from the demultiplexer-and-depuncturer 101, from the a posteriori probability $L(p'_i; O)$ of the parity data p' outputted from the parity output terminal p;O of the first APP decoder 103, to produce an output of extrinsic information $L_{ext}(P'_i)$ as to the parity $p_i$.

A fourth subtracter 110 subtracts the logarithmic-likelihood ratio $L(p2'_i)$ of the parity $p2'_i$ outputted from the demultiplexer-and-depuncturer 101, from the a posteriori probability $L(p2'_i;O)$ of the parity data p' outputted from the parity output terminal p;O of the second APP decoder 106, to produce an output of extrinsic information $L_{ext}(p2'_i)$ as to the parity $p2_i$.

A puncturer-and-multiplexer 111 receives inputs of the extrinsic information $L_{extB}(u'_i)$ as to the information data $u'_i$ outputted from the second subtracter 108, the extrinsic information $L_{ext}(p'_i)$ as to the parity $p_i$ outputted from the third subtracter 109, and the extrinsic information $L_{ext}(p2'_i)$ as to the parity $p2_i$ outputted from the fourth subtracter 110. Then, the inputted extrinsic information $L_{ext}(P'_i)$ and $L_{ext}(p2'_i)$ is partly punctured (deleted) so that a specified coding rate results. Then, the inputted extrinsic information $L_{extB}(u'_i)$ and the remaining extrinsic information $L_{ext}(p'_i)$ and $L_{ext}(p2'_i)$ that have not been punctured are united by the multiplexer function, resulting in serial data, which are outputted as a priori information $L_a(f'_i)$ as to the code data $f_i$. Like this, the puncturer-and-multiplexer 111 performs a processing similar to that of the puncturer-and-multiplexer 74. However, the puncturer-and-multiplexer 74 processes hard information, while the puncturer-and-multiplexer 111 processes soft information.

As shown above, in this embodiment, with the turbo coder 51 and the RLL modulator 52 incorporated in the recording-medium recording apparatus, channel data $a_t$ that has been subjected to both turbo coding and RLL modulation is recorded on the recording medium 54. Meanwhile, with the APP decoder 93 and the turbo decoder 94 incorporated in the recording-medium reproducing apparatus, turbo decoding is performed by repeatedly delivering logarithmic-likelihood ratios of code data $f'_i$ or information data $u'_i$ among the three APP decoders of the APP decoder 93, the first APP decoder 103 and the second APP decoder 106. As a result, as compared with the second embodiment, errors in reconstructed information data $u'_i$ can be further reduced. Decoding process is repeatedly performed in an order of the APP decoder 93 to the first APP decoder 103 to the second APP decoder 106.

In this case, the logarithmic-likelihood computing circuit 92 (provided at the preceding-stage of the APP decoder 93) and the APP decoder 93 have the same functions as the logarithmic-likelihood computing circuit 42 and the first APP decoder 43, respectively, shown in FIG. 1 in the first embodiment. Therefore, the APP decoder 93 has an APP decoding function of receiving inputs of the logarithmic likelihoods $L(y'_i|y_i)$ of the reproduced signal $y'_i$ derived from the logarithmic-likelihood computing circuit 92 and the a priori information as to code data, updating the code data $f'_i$ and producing outputs of a posteriori probabilities according to trellis diagram information (e.g., the conversion tables shown in FIGS. 7A and 7B) that satisfy both the constraints concerning RLL modulation stored in the ROM 93a and the constraints concerning PR transfer characteristics. Thus, an RLL demodulation based on soft information is enabled so that turbo decoding can be applied to the RLL demodulation.

As described above, in the third embodiment, the first APP decoding means is implemented by the APP decoder 93 in FIG. 12. Also, the second APP decoding means is implemented by the first APP decoder 103 and the second APP decoder 106 in FIG. 13.

Meanwhile, in the recording-medium recording apparatus shown in FIG. 9, an interleaver that performs interleaving may be provided between the turbo coder 51 and the RLL modulator 52. In such a case, in the recording-medium reproducing apparatus shown in FIG. 8, a deinterleaver is additionally provided between the APP decoder 63 and the turbo decoder 64. Also in the recording-medium reproducing apparatus of the third embodiment in FIG. 12, similarly, a deinterleaver that performs deinterleaving on the a posteriori probability $L(f'_i)$ of the code data $f'_i$ outputted from the APP decoder 93 to the turbo decoder 94 is provided, while an interleaver that performs interleaving on the a priori information $L_a(f'_i)$ as to the code data $f'_i$ outputted from the turbo decoder 94 to the APP decoder 93 is provided. Like this, by providing an interleaver and a deinterleaver between the turbo coder and the RLL modulator in the recording-medium recording apparatus and between the APP decoder and the turbo decoder in the recording-medium reproducing apparatus, burst errors contained in the reproduced signal $y'_i$ can be decomposed into random errors. As a result, errors contained in the reconstructed information data $u'_i$ can be further reduced.

In the individual embodiments described above, the convolutional code suitable for the turbo code method is used as the error-correcting code. However, the error-correcting code in the present invention is not limited to the convolutional code, and any error-correcting code allowing a soft-information input and soft-information output decoding process will do. In such a case, the APP decoder may appropriately be given by an APP decoder that performs APP decoding in compliance with constraints concerning error-correcting codes capable of the soft-information input and soft-information output decoding process.

Further, the turbo coder 51 in the recording-medium recording apparatus shown in FIG. 9 has been explained taking a PCCC-system turbo coder composed of two convolutional coders as an example. However, without being limited to this, the present invention allows the use of PCCC-system turbo coders composed of three or more convolutional coders, or turbo coders of the serially concatenated convolutional code system, or the like. In such a case, the turbo decoder 64, 94 of the recording-medium reproducing apparatus may be a turbo decoder which performs a decoding corresponding to a turbo coding system used. That is, the turbo coding system has only to be an error-correcting coding system allowing the soft-information input and soft-information output decoding process. Accordingly, the turbo coder 51 has only to be an error-correcting coder allowing a soft-information input and soft-information output decoding process and the turbo decoder 64, 94 in turn has only to be a decoder capable of soft-information input and soft-information output for the relevant error-correcting codes.

In addition, although the logarithmic-likelihood ratios in the above individual embodiments are real numbers, yet those numbers may be numbers quantized with floating-point precision or fixed-point precision, and furthermore may be numbers of integer precision. Generally, the floating-point precision, the fixed-point precision and the integer precision are ranked in terms of arithmetic precision, higher to lower, in this order.

Further, logarithmic-likelihood ratios have been used as the likelihood to be inputted or outputted by each block in the above embodiments, since the use of logarithmic-likelihood ratios allows the computing amount to be reduced. However, without being limited to logarithmic-likelihood ratios, the present invention allows each block to input or output, for example, a probability value as it is. In such a case, the subtracters should be replaced with dividers and the adders should be replaced with multipliers.

Furthermore, in order to further reduce the error rate, in the first embodiment, an error-correcting coder may be provided as outer codes while the convolutional coder 31 is set as inner codes. Also, additionally providing an interleaver between the error-correcting coder for outer codes and the convolutional coder 31 for inner codes allows the error rate to be further reduced. In such a case, in an associated recording-medium reproducing apparatus corresponding to this, it is appropriate that a deinterleaver and an error-correcting-code decoder are connected sequentially to the information output terminal u;O of the second APP decoder 46. Similarly, in the second and third embodiments, an error-correcting coder may additionally be provided as outer codes while the turbo coder 51 is set as inner codes. Also, additionally providing an interleaver between the error-correcting coder for outer codes and the turbo coder 51 for inner codes allows the error rate to be further reduced. In such a case, in a recording-medium reproducing apparatus corresponding to this, it is appropriate that a deinterleaver and an error-correcting-code decoder are connected sequentially to an output $L_{out}(f'_i)$ of the turbo decoder 64, 94.

Figure 14:
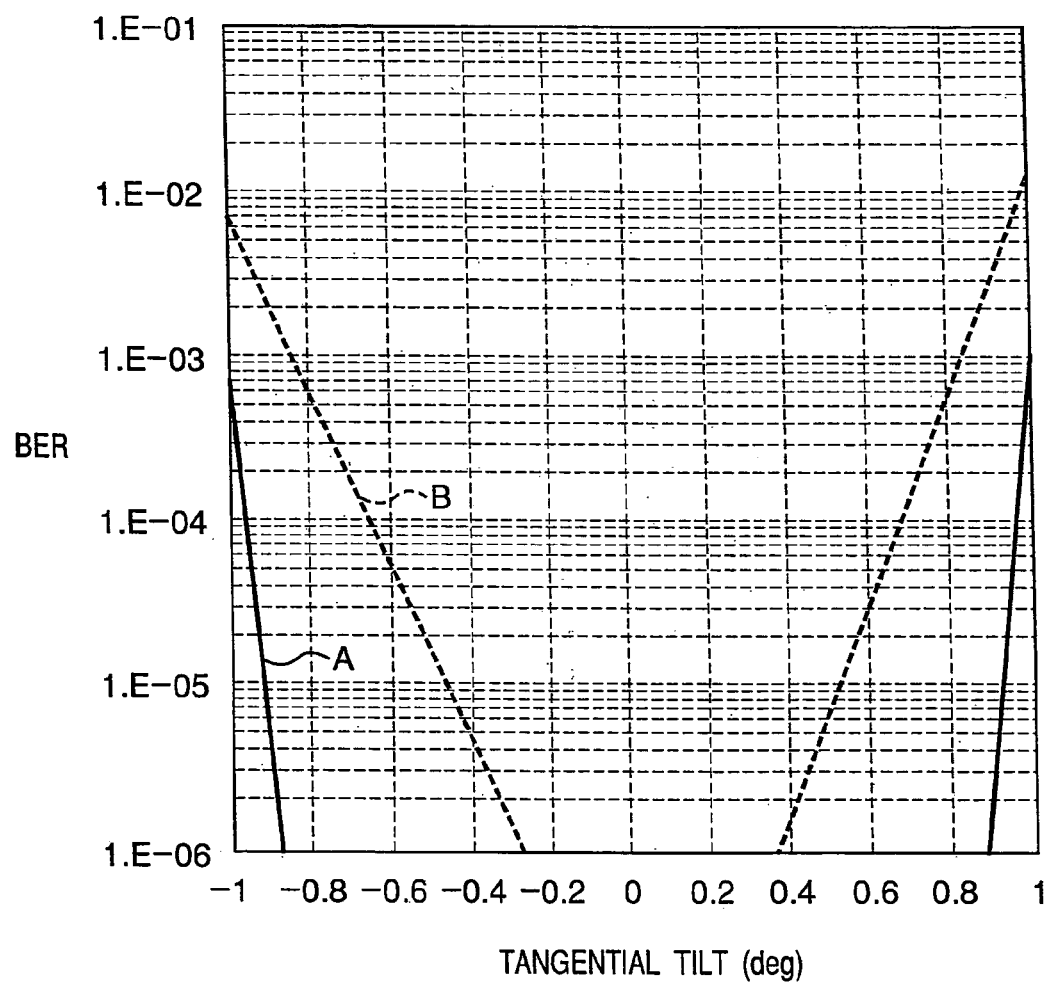
FIG. 14 is a comparative chart of bit error rate measurement results between a conventional art and a modification of the third embodiment, where the recording density is 12.5 kbits/mm.
Figure 15:
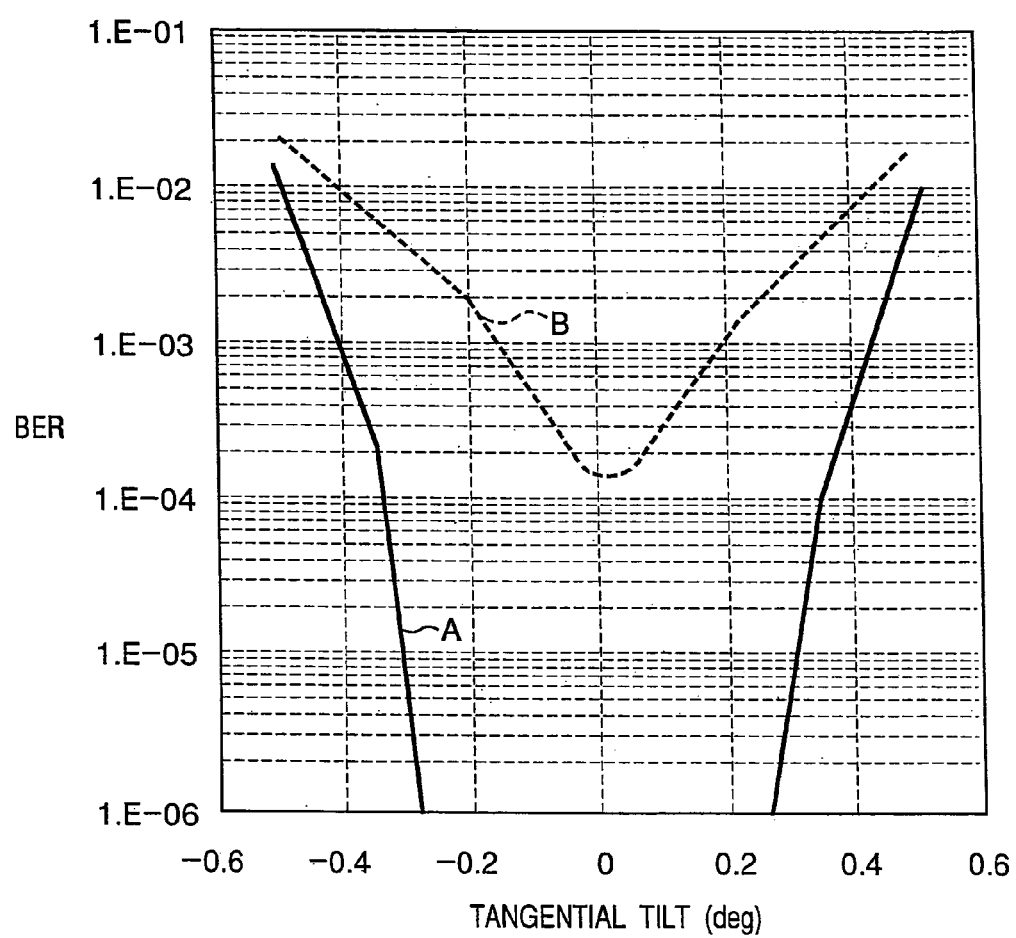
FIG. 15 is a comparative chart of bit error rate measurement results between a conventional art and the modification of the third embodiment, where the recording density is 15.7 kbits/mm.
Figure 20:
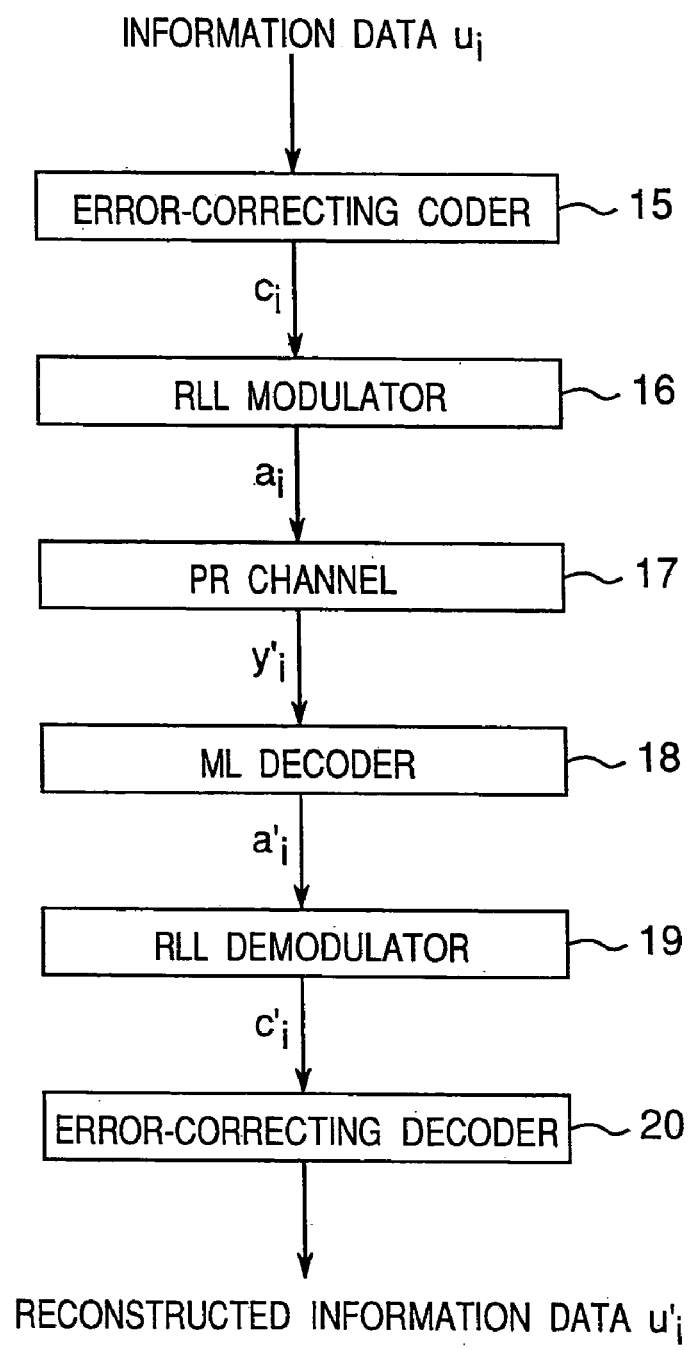
FIG. 20 is a block diagram of the background-art recording and reproducing apparatus to which an RLL modulation method is applied.
Figure 21:
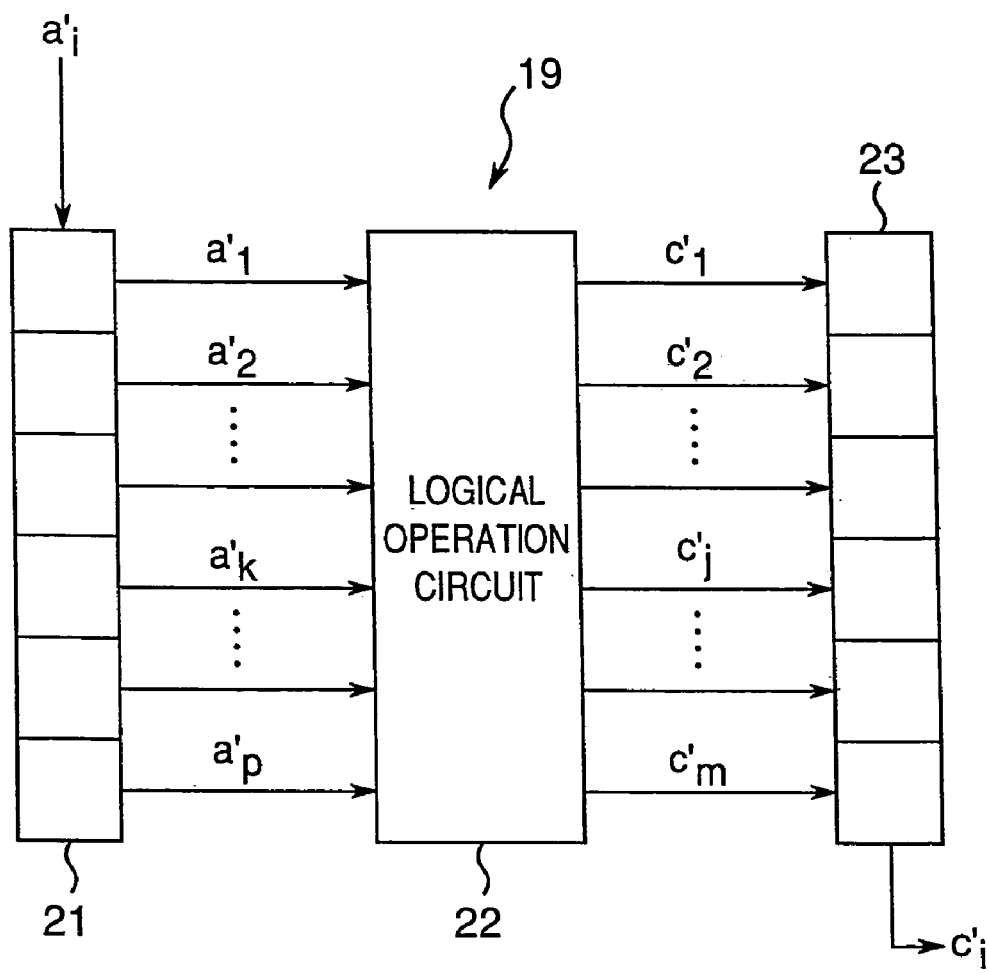
FIG. 21 is a block diagram of the background-art RLL demodulator in FIG. 20.

FIGS. 14 and 15 are charts showing comparisons of measurement results of the bit error rate (BER) between the FIG. 20 conventional recording-medium recording and reproducing apparatus and a combination of a modification of the FIG. 9 recording-medium recording apparatus in which an interleaver for performing interleaving is disposed between the turbo coder 51 and the RLL modulator 52 and a modification of the FIG. 12 recording-medium reproducing apparatus in which an interleaver and a deinterleaver are disposed between the APP decoder 93 and the turbo decoder 94. In these figures, the horizontal axis represents the tangential tilt of the recording medium and the vertical axis represents the bit error rate (BER). Also, in the figures, the solid line A represents the combined modifications of the present invention, while the broken line B represents the conventional art. The recording medium was given by a phase-change disk.

In FIG. 14, the recording density, i.e. the number of channel bits per mm, is 12.5 kbits/mm. As can be understood from FIG. 14, the combined modifications are capable of relaxing or enlarging the tolerances for tangential tilt, as compared with the conventional art. For example, the tangential tilt at which the bit error rate is $10^{-4}$ (i.e., 1.E-04) or lower falls within a range of ±0.7 degrees in the conventional art, whereas it falls within a range of ±0.9 degrees in the combined modifications, showing a relaxation of 0.2 degree.

In FIG. 15, the recording density is 15.7 kbits/mm, showing a 126% increase of recording density, compared with the case of FIG. 14 in which the recording density is 12.5 kbits/mm. As can be understood from FIG. 15, for example, the tangential tilt at which the bit error rate is $10^{-4}$ or lower falls within a range of ±0.3 degrees in the combined modifications. On the other hand, in the conventional art, the bit error rate cannot be $10^{-4}$ or lower at a tangential tilt range of ±0.3 degrees, resulting in degraded reliability of reconstructed information data. As is obvious, the recording density can be enhanced by the present invention.

In the modification of the FIG. 9 recording-medium recording apparatus, with which the bit error rate was measured, an interleaver for performing interleaving is disposed between the turbo coder 51 and the RLL modulator 52 as described above, and the interleaver length is set to 4000. In correspondence to this interleaver, an interleaver and a deinterleaver are disposed between the APP decoder 93 and the turbo decoder 94 in the modification of the FIG. 12 recording-medium reproducing apparatus. The RLL modulation method of the RLL modulator 52 was the above-described RLL(1, 7). The turbo coder 51 was of the PCCC system shown in FIG. 10, and the interleaver length of the interleaver 72 is 3800. Checking or generating polynomials of convolutional codes in the first convolutional coder 71 and the second convolutional coder 73 were so set that a feedback polynomial was 31 (in octal number) and,a feed forward polynomial was 33 (in octal number). Further, the puncturer-and-multiplexer 74 performed such a puncture that the code rate of turbo codes (i.e., a proportion of information data in code data) becomes 95%. The bit error rate here was given by measuring a bit error rate concerning the information data $u'_i$ reconstructed after eight iterations of decoding.

On the other hand, in the conventional recording-medium recording and reproducing apparatus shown in FIG. 20, with which the bit error rate was measured, the pass memory length of the ML decoder 18 was set to 24. The bit error rate was given by measuring a bit error rate concerning the reconstructed decoded data $c'_i$.

Tolerances for the tangential tilt have been mentioned above by referring to FIGS. 14 and 15. However, the present invention makes it possible to relax or make less strict tolerances not only for the tangential tilt but for any parameters that would degrade the bit error rate.

Fourth Embodiment

Figure 16:
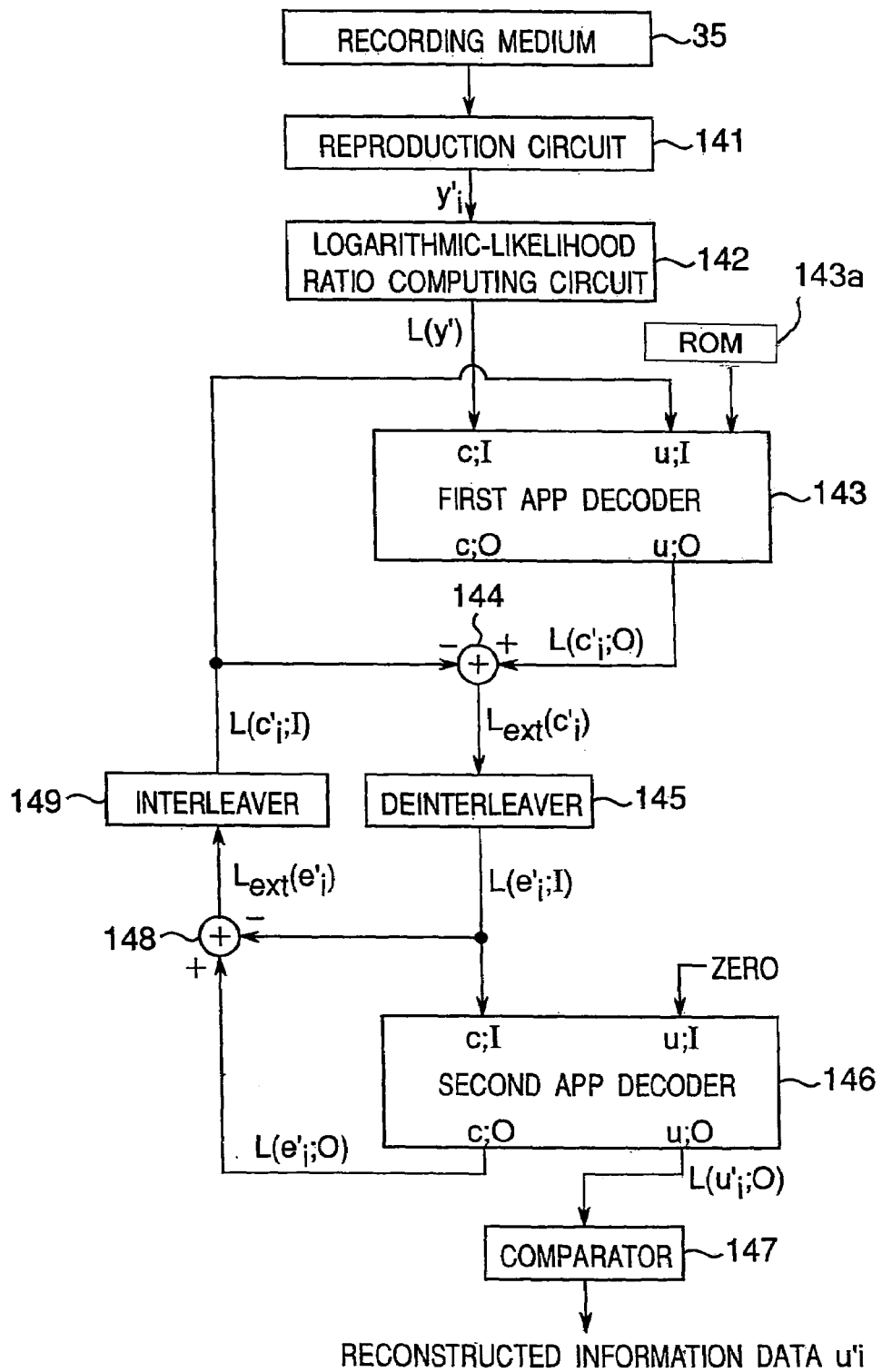
FIG. 16 is a block diagram of a recording-medium reproducing apparatus in a fourth embodiment of the invention.

FIG. 16 is a block diagram of a recording-medium reproducing apparatus in a fourth embodiment. This recording-medium reproducing apparatus serves for reproduction from a recording medium on which channel data $a_i$ has been recorded by the recording-medium recording apparatus shown in FIG. 2. The recording-medium recording apparatus shown in FIG. 2 has been explained in connection with the first embodiment and so its description is omitted.

The recording-medium reproducing apparatus shown in FIG. 16 will be explained. A reproduction circuit 141 reproduces channel data recorded on a recording medium 35, and outputs a reproduced signal $y'_i$. A recording circuit 34, the recording medium 35 and the reproduction circuit 141 constitute a channel. It is assumed that the reproduction circuit 141 is operative to equalize the reproduced signal $y'_i$ so that Nyquist's first criterion is satisfied. Accordingly, the reproduced signal $y'_i$ is free from intersymbol interference. Besides, the reproduced signal $y'_i$, when passing the channel, undergoes deformation such as noise addition, band limiting or crosstalk. Therefore, the reproduced signal $y'_i$ contains errors.

A logarithmic-likelihood computing circuit 142 serving as the probability computing means computes a logarithmic likelihood based on the inputted reproduced signal $y'_i$, and outputs a logarithmic likelihood ratio $L(y'_i)$ of the reproduced signal $y'_i$. This logarithmic likelihood ratio $L(y'_i)$ is then inputted to a code input terminal c;I of a first APP decoder 143. Further, an output $L(c'_i;I)$ of an interleaver 149 serving as the interleaving means is inputted to an information input terminal u;I of the first APP decoder 143. The output $L(c'_i;I)$, in which extrinsic information of code data $e'_i$ updated by a second APP decoder 146 has been interleaved, is inputted to the first APP decoder 143 as a priori information of the code data $c'_i$.

The first APP decoder 143 performs APP decoding in compliance with constraints regarding the modulation. Then, the first APP decoder 43 outputs a posteriori probabilities $L(c'_i;O)$ of the code data $c'_i$ from the information output terminal u;O. The code output terminal c;O, from which the a posteriori probabilities $L(y'_i;O)$ of the PR channel data $y'_i$ are outputted, is connected to none. That is, the first APP decoder 143 updates the individual likelihoods based on the constraints concerning modulation.

It is noted here that logarithmic-likelihood ratios are used to express probability values in the fourth embodiment, similarly to the preceding embodiments. For example, the logarithmic-likelihood ratio concerning code data $c_i$ is defined by Equation (1), which has been explained in connection with the first embodiment.

The recording-medium reproducing apparatus of the fourth embodiment also has a first subtracter 144, a deinterleaver 145, the second APP decoder 146, a comparator 147, a second subtracter 148, and the interleaver 149. These components have structures and functions same as the first subtracter 44, the deinterleaver 45, the second APP decoder 146, the comparator 47, the second subtracter 48, and the interleaver 49, respectively, of the recording-medium reproducing apparatus of the first embodiment shown in FIG. 1. Thus, it should be understood that the explanation made on these components in the first embodiment is applied to the corresponding components of the present embodiment.

As already described in connection with the first embodiment, in the recording-medium recording apparatus shown in FIG. 2, the code data $c_i$ is subjected to RLL modulation by the RLL modulator 33, thereby transformed into channel data $a_i$ based on the NRZ rules and recorded on the recording medium 35. The recording circuit 34, the recording medium 35 and the reproduction circuit 141 are equalized so as to meet Nyquist's first criteria. In this case, the reproduced signal $y_i$ reproduced by the reproduction circuit 141 of the recording-medium reproducing apparatus shown in FIG. 16 can be said to be a reproduced signal of a signal which is obtained by transforming the code data $c_i$ into the channel data $a_i$ based on the NRZ rules in compliance with the conversion tables (which correspond to the constraints concerning the RLL modulation in the fourth embodiment) shown in FIGS. 6A and 6B.

Therefore, in this recording-medium reproducing apparatus, the conversion tables shown in FIGS. 6A and 6B based on the trellis diagram (which correspond to the constraints concerning the RLL modulation in the fourth embodiment) shown in FIG. 5 are preparatorily stored in a ROM 143a or the like as the trellis diagram information. Then, the first APP decoder 143 performs APP decoding in compliance with the conversion tables.

Next, contents of arithmetic operation by the logarithmic-likelihood ratio computing circuit 142 are explained in detail. Generally, this operation is carried out on the assumption that the channel is a simple noise-addition source. That is, a pre-demodulation reproduced signal $y'_i$ is defined by the foregoing Equation (3) (see the first embodiment).

It is also assumed that $y_i$ is normalized to take a value of either "+1" or "−1." That is, $$y_i = 2a_i - 1 \qquad (15)$$

As described above, since $y_i$ is a value of either "+1" or "−1," the logarithmic-likelihood ratio $L(y'_i)$ of the pre-demodulation reproduced signal $y'_i$ of the reproduced signal $y'_i$ is defined by the following Equation (16), in the same way as Equation (1):

$$L(y'_i) = \ln \frac{P(y'_i | y_i = +1)}{P(y'_i | y_i = -1)} \qquad (16)$$

In this case, assuming that the channel is a white Gaussian channel, the conditional probability density at which $y'_i$ is received when $y_i$ is transmitted can be expressed as shown by the following Equation (17):

$$P(y'_i | y_i) = \frac{1}{\sigma_n \sqrt{2\pi}} \cdot \exp\left[-\frac{(y'_i - y_i)^2}{2\sigma_n^2}\right] \qquad (17)$$

where $\sigma_n$, is an effective amplitude (standard deviation) of this noise. Also, exp represents an exponential function. Then, from Equations (16) and (17), the logarithmic-likelihood ratio of the received signal $y'_i$ can be calculated by the following Equation (18):

$$L(y'_i) = Lc \cdot y'_i \qquad (18)$$

where Lc is a constant determined by power of noise $n_i$, and the power of noise $n_i$ is the square of $\sigma_n$. Therefore, the constant Lc is expressed by the following Equation (19):

$$Lc = 2/\sigma_n^2 \qquad (19)$$

Accordingly, by multiplying the inputted pre-demodulation reproduced signal $y'_i$ by the constant Lc, the logarithmic-likelihood computing circuit 142 can obtain the logarithmic-likelihood ratio $L(y'_i)$ of the reproduced signal $y'_i$. Like this, the logarithmic-likelihood computing circuit 142 outputs one value $L(y'_i)$ for one received value $y'_i$.

Also, from Equations (15) and (16), the following Equation (19) is obtained:

$$L(a'_i) = \ln \frac{P(a'_i | a_i = 1)}{P(a'_i | a_i = 0)} = L(y'_i) \qquad (20)$$

That is, the logarithmic-likelihood ratio $L(a'_i)$ of the channel data $a'_i$ and the logarithmic-likelihood ratio $L(y'_i)$ of the reproduced signal $y'_i$ become equal to each other. Therefore, the first APP decoder 143 is allowed to regard the logarithmic-likelihood ratio $L(y'_i)$, which is inputted to the code input terminal c;I, as the logarithmic-likelihood ratio $L(a'_i)$ of the channel data $a'_i$ as it is, and to accomplish the decoding as such.

As shown above, in the recording-medium reproducing apparatus of the fourth embodiment, at the preceding stage of the first APP decoder 143 out of the two APP decoders that perform turbo decoding is disposed the logarithmic-likelihood ratio computing circuit 142 that generates and outputs the logarithmic likelihood $L(y'_i)$ of a pre-demodulation reproduced signal $y'_i$. Further, the first APP decoder 143 has an APP decoding function of receiving inputs of the logarithmic likelihood $L(y'_i)$ of the reproduced signal $y'_i$ and the a priori information as to the code data $c'_i$, updating the code data $c'_i$ and outputs a posteriori probability according to trellis diagram information (e.g., the conversion tables shown in FIGS. 6A and 6B), stored in the ROM 143a, that represents constraints concerning RLL modulation.

Thus, an RLL demodulation based on soft information is available so that turbo decoding can be applied to the RLL demodulation. Therefore, information data can be reconstructed with high error-correcting capability from a recording medium on which channel data $a_i$ obtained by subjecting the information data $u_i$ to convolutional coding and RLL modulation has been recorded, as in the recording-medium recording apparatus shown in FIG. 2. That is, according to this embodiment, recording density onto the recording medium can be enhanced.

Note that the modified structures of the subtracters 44, 48 (the second and third arrangements) explained in the first embodiment are applicable also to the subtracters 144, 148 of this fourth embodiment. That is, the subtracters 144, 148 may appropriately be disposed so that their computation results become absolutely the same in each case.

Fifth Embodiment

Figure 17:
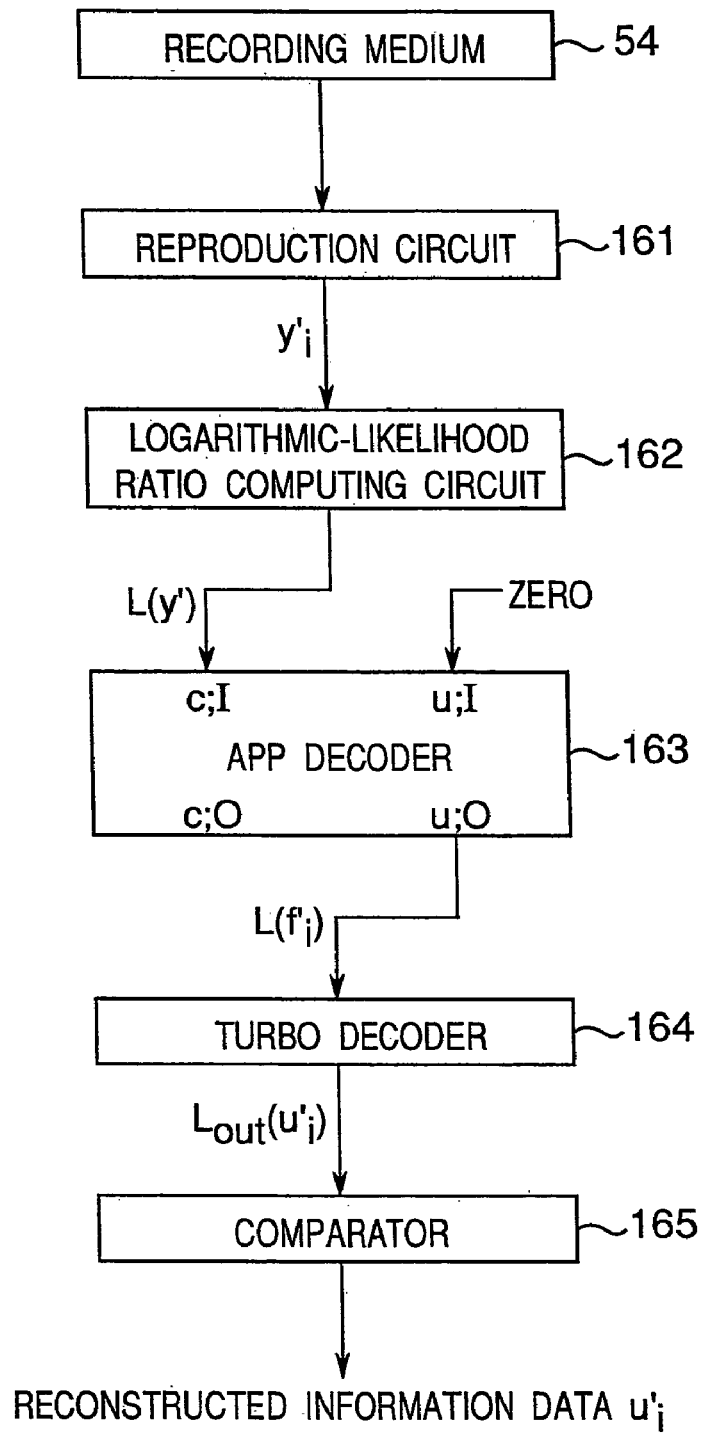
FIG. 17 is a block diagram of a recording-medium reproducing apparatus in a fifth embodiment of the invention.

FIG. 17 is a block diagram of a recording-medium reproducing apparatus in a fifth embodiment. Similarly to the recording-medium reproducing apparatuses in the second and third embodiments, the recording-medium reproducing apparatus of the present embodiment also serves for reproduction from a recording medium 54 on which channel data $a_i$ has been recorded by the recording-medium recording apparatus shown in FIG. 9.

The general structure of the recording-medium recording apparatus shown in FIG. 9 and the details, shown in FIG. 10, of the turbo coder 51 included in the recording apparatus are as described above. This recording apparatus performs both turbo coding and RLL modulation.

Next, the recording-medium reproducing apparatus shown in FIG. 17 will be explained. A reproduction circuit 161 and a logarithmic-likelihood ratio computing circuit 162 are the same as the reproduction circuit 141 and the logarithmic-likelihood ratio computing circuit 142, respectively, of the recording-medium reproducing apparatus shown in FIG. 16 in the fourth embodiment, and so a detailed description on them is omitted. A logarithmic likelihood ratio $L(y'_i)$ outputted from the logarithmic-likelihood ratio computing circuit 162 serving as the probability computing means is inputted to the code input terminal c;I of an APP decoder 163. Further, a zero is inputted at all times to the information input terminal u;I of the APP decoder 163. That is, the APP decoder 163 performs the a posteriori probability (APP) decoding under the condition that a priori information $L_a(f'_i)$ is absent. Then, the APP decoder 163 outputs an a posteriori probability $L(f'_i)$ of the code data $f'_i$ from the information output terminal u;O.

Also in this recording-medium reproducing apparatus as well, the conversion tables shown in FIGS. 6A and 6B based on the trellis diagram are previously stored in a ROM 163a or the like. Then, the APP decoder 163 performs APP decoding in compliance with constraints concerning the RLL modulation. As a result, a soft-input and soft-output RLL demodulation becomes available, thus the APP decoder 163 being usable in combination with a succeeding-stage turbo decoder 164.

Receiving a logarithmic-likelihood ratio $L(f'_i)$ of code data $f'_i$ from the APP decoder 163, the turbo decoder 164, produces an output of an APP decoding result $L_{out}(u'_i)$ of information data. In this case, the turbo decoder 164 performs a decoding corresponding to the coding performed by the turbo coder 51 of the recording-medium recording apparatus shown in FIG. 9. A detailed description of the turbo decoder 164 is omitted here because the turbo decoder 164 has the same configuration as the turbo decoder 64 shown in FIG. 8 in the second embodiment (its details are shown in FIG. 11) and all the description made on the turbo decoder 64 is applied to the turbo decoder 164. A comparator 165 binarizes the APP decoding result $L_{out}(u'_i)$ inputted from the turbo decoder 164, and outputs reconstructed information data $u'_i$.

As shown above, in the fifth embodiment, with the turbo coder 51 and the RLL modulator 52 incorporated in the recording-medium recording apparatus, channel data $a_i$ that has been subjected to both turbo coding and RLL modulation is recorded on the recording medium 54. Meanwhile, with the turbo decoder 164 incorporated in the recording-medium reproducing apparatus, turbo decoding is performed. As a result, as compared with the fourth embodiment, information data can be reconstructed with higher error-correcting capability, so that the recording density onto the recording medium can be enhanced. Further, tolerances for recording media and tolerances for the recording-medium reproducing apparatus are allowed to be larger or less strict.

In the fifth embodiment, in the recording-medium reproducing apparatus, at the preceding stage of the turbo decoder 164 are disposed the logarithmic-likelihood ratio computing circuit 162 and the APP decoder 163 having the same functions as the logarithmic-likelihood ratio computing circuit 142 and the first APP decoder 143, respectively, shown in FIG. 16 in the fourth embodiment. Accordingly, the APP decoder 163 has an APP decoding function of receiving logarithmic likelihood ratios $L(y'_i)$ of reproduced signals $y'_i$ derived from the logarithmic-likelihood ratio computing circuit 162, and updating the code data $f'_i$ and outputs a posteriori probabilities according to trellis diagram information (e.g., conversion tables shown in FIGS. 6A and 6B) which is stored in the ROM 163a and which satisfies constraints concerning the RLL modulation. Thus, the RLL demodulation based on soft information is enabled so that turbo decoding becomes applicable to the RLL demodulation.

In the fifth embodiment, as described above, the first APP decoding means is implemented by the APP decoder 163 in FIG. 17. Further, the second APP decoding means is implemented by the first APP decoder 83 and the second APP decoder 86 in FIG. 11.

Sixth Embodiment

Figure 18:
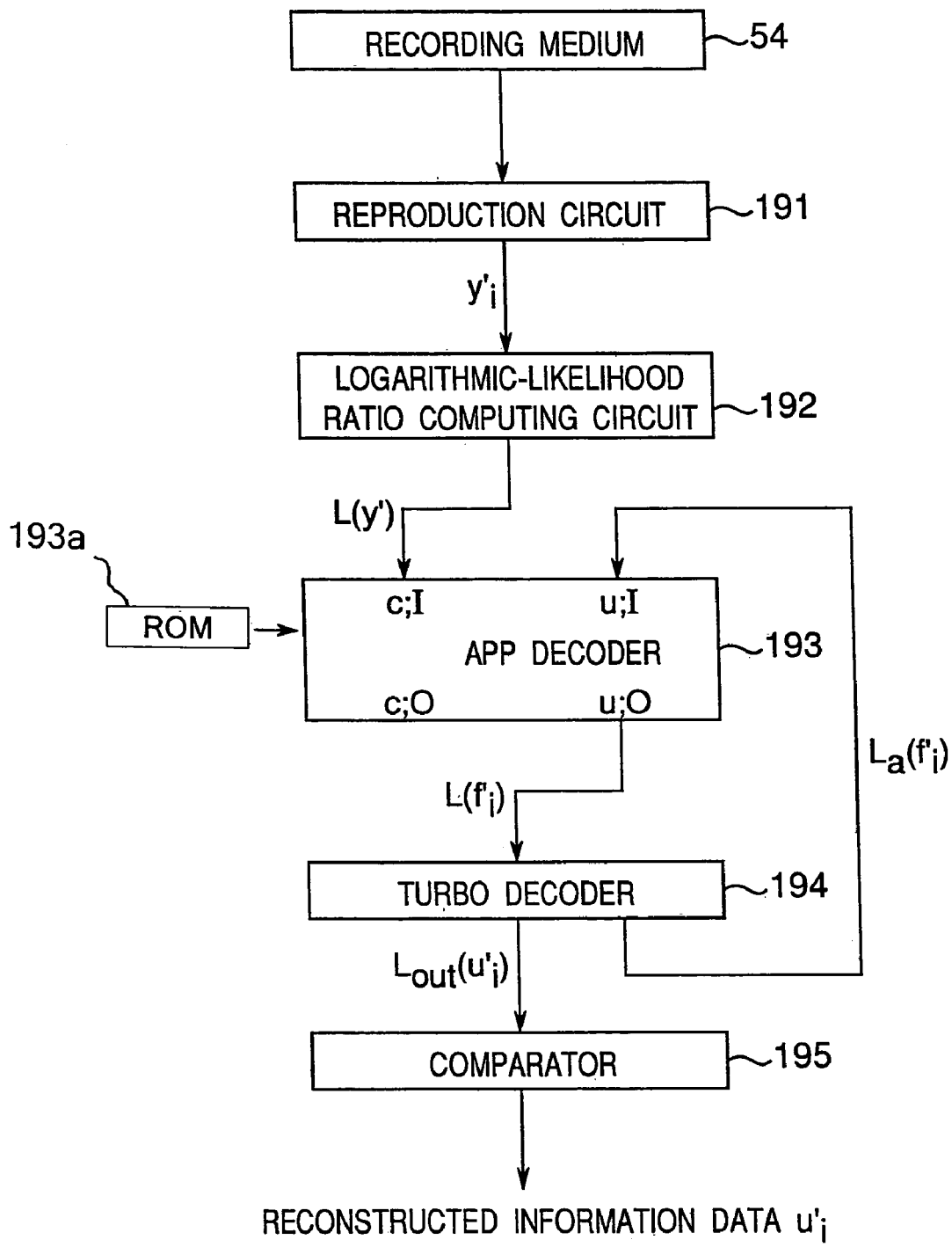
FIG. 18 is a block diagram of a recording-medium reproducing apparatus in a sixth embodiment of the invention.
Figure 19:
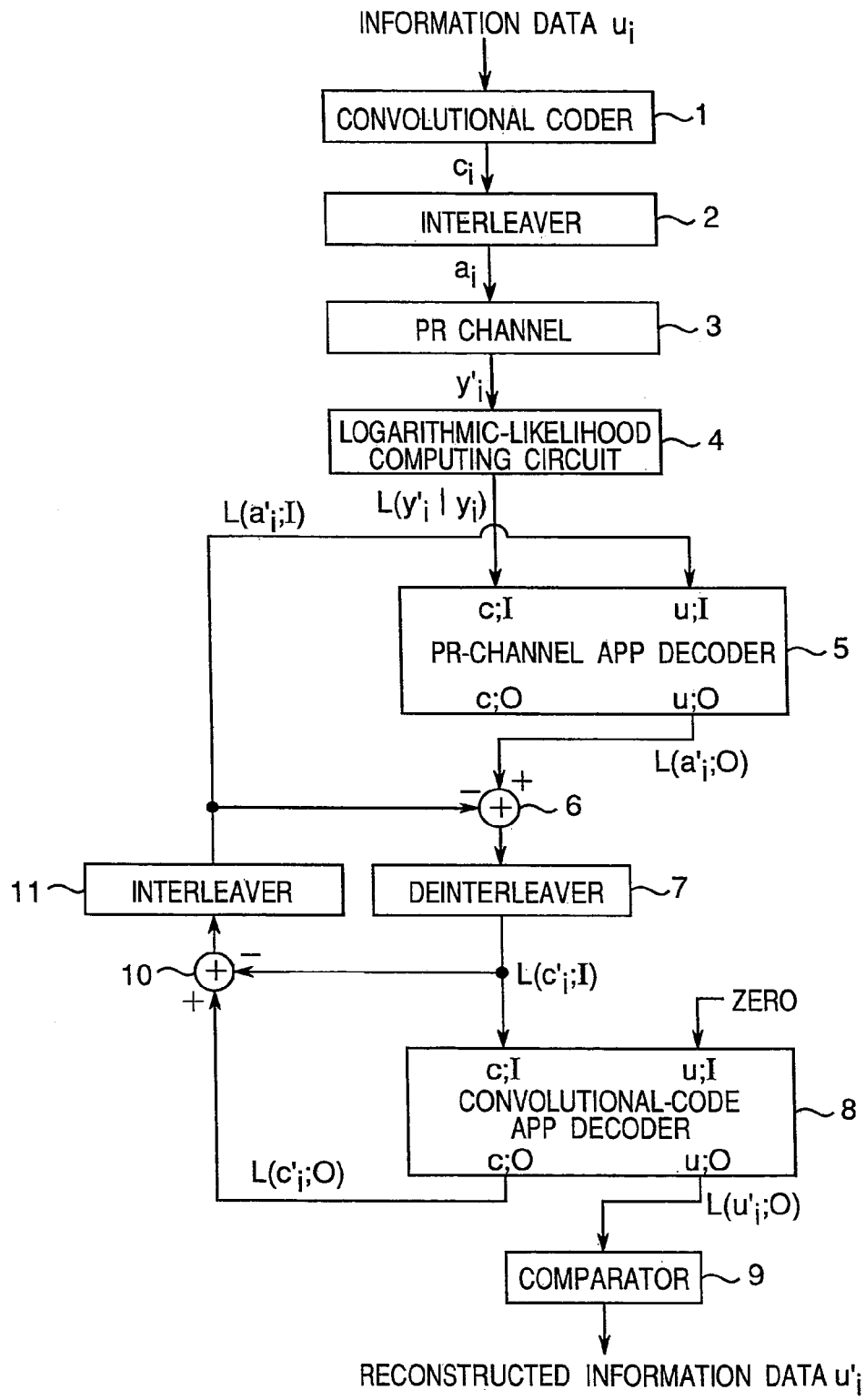
FIG. 19 is a block diagram of the background-art recording and reproducing apparatus which performs coding and decoding of turbo codes.

FIG. 18 is a block diagram of a recording-medium reproducing apparatus in a sixth embodiment. This recording-medium reproducing apparatus also serves for reproduction from a recording medium 54 on which channel data $a_i$ has been recorded by the recording-medium recording apparatus shown in FIG. 9.

A reproduction circuit 191 and a logarithmic-likelihood ratio computing circuit 192 are the same as the reproduction circuit 141 and the logarithmic-likelihood ratio computing circuit 142, respectively, of the recording-medium reproducing apparatus shown in FIG. 16 of the fourth embodiment, and a comparator 195 is the same as the comparator 165 shown in FIG. 17 of the fifth embodiment, and so a detailed description on these components is omitted. A logarithmic likelihood ratio $L(y'_i)$ outputted from the logarithmic-likelihood ratio computing circuit 192 serving as the probability computing means is inputted to the code input terminal c;I of an APP decoder 193. Further, a priori information $L_a(f'_i)$ as to code data $f'_i$ outputted from a turbo decoder 194 is inputted to the information input terminal u;I of the APP decoder 193. That is, the APP decoder 193 performs APP decoding based on the a priori information $L_a(f'_i)$ as to the code data $f'_i$ and the logarithmic likelihood ratio $L(y'_i)$ of the reproduced signal $y'_i$, and outputs an a posteriori probability $L(f'_i)$ of the code data $f'_i$ from the information output terminal u;O.

In this recording-medium reproducing apparatus also, the conversion tables shown in FIGS. 6A and 6B based on the trellis diagram are preparatorily stored in a ROM or the like. Then, the APP decoder 193 performs the APP decoding in compliance with constraints concerning the RLL modulation according to the conversion tables. As a result of this, an RLL demodulation with an input of soft information and an output of soft information is enabled, allowing the succeeding-stage turbo decoder 194 to be used in combination with the APP decoder 913.

Receiving an a posteriori probability $L(f'_i)$ of code data $f'_i$ from the APP decoder 193, the turbo decoder 194 performs the decoding and outputs an APP decoding result $L_{out}(u'_i)$ of the information data and a priori information $L_a(f'_i)$ as to the code data. In this case, the turbo decoder 194 performs a decoding corresponding to the coding performed by the turbo coder 51 in the recording-medium recording apparatus shown in FIG. 9. A detailed description of the turbo decoder 194 is omitted here because the turbo decoder 194 has the same configuration as the turbo decoder 94 shown in FIG. 12 in the third embodiment (its details are shown in FIG. 13) and all the description made on the turbo decoder 94 is applied to the turbo decoder 194.

Iterative decodings are performed by repeatedly delivering logarithmic-likelihood ratios of code data $f'_i$ between the APP decoder 193 and the APP decoder 194, allowing errors in the reconstructed information data $u'_i$ to be reduced. In this case, in the first iteration of a decoding operation, the a priori information $L_a(f'_i)$, which is inputted to the information input terminal u;I of the APP decoder 193, is set to zero.

As shown above, in the sixth embodiment, with the turbo coder 51 and the RLL modulator 52 incorporated in the recording-medium recording apparatus, channel data $a_i$ that has been subjected to both turbo coding and RLL modulation is recorded on the recording medium 54. Meanwhile, with the APP decoder 193 and the turbo decoder 194 incorporated in the recording-medium reproducing apparatus, turbo decoding is performed by repeatedly delivering logarithmic-likelihood ratios of code data $f'_i$ or information data $u'_i$ among the three APP decoders of the APP decoder 193, the first APP decoder 103 and the second APP decoder 106 (FIG. 13). As a result, as compared with the fifth embodiment, errors in reconstructed information data $u'_i$ can be further reduced. Decoding process is repeatedly performed in an order of the APP decoder 193 to the first APP decoder 103 to the second APP decoder 106.

In this case, the logarithmic-likelihood ratio computing circuit 192 (provided at the preceding-stage of the APP decoder 193) and the APP decoder 193 have the same functions as the logarithmic-likelihood ratio computing circuit 142 and the first APP decoder 143, respectively, shown in FIG. 16 in the fourth embodiment. Therefore, the APP decoder 193 has an APP decoding function of receiving inputs of the logarithmic likelihood ratios $L(y'_i)$ of the reproduced signals $y'_i$ derived from the logarithmic-likelihood ratio computing circuit 192 and the a priori information as to code data, updating the code data $f'_i$ and producing outputs of a posteriori probabilities according to trellis diagram information stored in the ROM 193a (e.g., the conversion tables shown in FIGS. 6A and 6B) that satisfy the constraints concerning RLL modulation. Thus, an RLL demodulation based on soft information is possible so that turbo decoding can be applied to the RLL demodulation.

As described, in the sixth embodiment, the first APP decoding means is implemented by the APP decoder 193 in FIG. 18. Also, the second APP decoding means is implemented by the first APP decoder 103 and the second APP decoder 106 in FIG. 13.

Various changes and modifications can be made to the fourth to sixth embodiments, and it should be understood that the above-described examples of changes and modifications for the first to third embodiments are of course applicable to the fourth to sixth embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A decoding method for decoding of data which has been subjected to an RLL modulation so as to be formed into channel input data, the channel input data being to be reproduced over a passage through a channel, where the decoding of data is performed based on channel output data, wherein:
   the decoding is performed through an APP decoding process in compliance with constraints representing correspondences between RLL modulator input data and channel output data by using no more than one decoder.

2. The decoding method according to claim 1, wherein the channel has a PR transfer characteristic; and
   the constraints representing correspondences between RLL modulator input data and channel output data that are used in the APP decoding process are constraints that satisfy both constraints concerning the RLL modulation and constraints concerning the PR transfer characteristic.

3. The decoding method according to claim 1, wherein the APP decoding process is performed based on trellis diagram information representing the constraints representing correspondences between RLL modulator input data and channel output data, which information is stored in a memory.

4. A decoding method for decoding of information data which has been subjected to an error-correcting coding so as to be formed into code data, the code data being subjected sequentially to a pseudo-random interleaving and an RLL modulation so as to be formed into channel input data, the channel input data being to be reproduced over a passage through a channel, where the information data is decoded based on channel output data, the decoding method comprising:

computing bit-wise probabilities of the channel output data by probability computing means;

performing, by first APP decoding means consisting of no more than one decoder, a first APP decoding process for, upon receiving inputs of bit-wise probabilities of the channel output data and first a priori information concerning the code data, creating and outputting first a posteriori probabilities of the code data in compliance with constraints representing correspondences between RLL modulator input data and channel output data;

performing, by deinterleaving means, a deinterleaving process for subjecting, to deinterleaving of the pseudo-random interleaving, a probability value relating to a first a posteriori probability of the code data outputted from the first APP decoding means by deinterleaving means to thereby create and output second a priori information concerning the code data;

performing, by second APP decoding means, a second APP decoding process for, upon receiving an input of the second a priori information concerning code data, creating and outputting a posteriori probability of the information data and a second a posteriori probability of the code data in compliance with constraints concerning error-correcting codes;

performing, by interleaving means, an interleaving process for subjecting, to the pseudo-random interleaving, a probability value relating to the second a posteriori probability of the code data outputted from the second APP decoding means to thereby create and output first a priori information concerning the code data;

performing, by first computing means, a first computation process for either creating first extrinsic information concerning code data updated by the first APP decoding process based on the probability value before the deinterleaving process and the probability value after the interleaving process and outputting the first extrinsic information to the deinterleaving means as a probability value relating to the first a posteriori probability, or for creating the first extrinsic information based on the probability value after the deinterleaving process and the probability value before the interleaving process and outputting the first extrinsic information to the second APP decoding means as the second a priori information; and performing, by second computing means, a second computation process for either creating second extrinsic information concerning code data updated by the second APP decoding process based on the probability value before the interleaving process and the probability value after the deinterleaving process and outputting the second extrinsic information to the interleaving means as a probability value relating to the second a posteriori probability, or for creating second extrinsic information based on the probability value after the interleaving process and the probability value before the deinterleaving process and outputting the second extrinsic information to the first APP decoding means as the first a priori information, said processes being iteratively performed to implement an iterative decoding.

5. The decoding method according to claim 4, wherein the error-correcting coding is a turbo coding; and the second APP decoding process is a turbo decoding process corresponding to the turbo coding.

6. The decoding method according to claim 4, wherein the channel has a PR transfer characteristic; and the constraints representing correspondences between RLL modulator input data and channel output data that are used in the first APP decoding process are constraints that meet both constraints concerning the RLL modulation and constraints concerning the PR transfer characteristic.

7. The decoding method according to claim 4, wherein the first APP decoding process is performed in compliance with trellis diagram information representing the constraints representing correspondences between RLL modulator input data and channel output data, which information is stored in a memory.

8. The decoding method according to claim 4, wherein the error-correcting coding is convolutional coding.

9. The decoding method according to claim 4, wherein logarithmic-likelihood ratios are used as the probability and a posteriori probability, while logarithmic-likelihood ratio values are used as the a priori information and extrinsic information.

10. A recording-medium reproducing apparatus comprising:

reproduction means for, from a recording medium on which channel data is recorded, the channel data resulting from subjecting information data to error-correcting coding to create code data, subjecting the code data to pseudo-random interleaving and RLL modulation, reproducing the recorded channel data and outputting the reproduced data as channel output data; and decoding means for obtaining a posteriori probabilities of the information data from the reproduced data by the decoding method according to claim 4, and reconstructing the information data according to the a posteriori probabilities of the information data.

11. A decoding method for decoding of information data which has been subjected to an error-correcting coding so as to be formed into code data, the code data being subjected to an RLL modulation so as to be formed into channel input data, the channel input data being to be reproduced over a passage through a channel, where the information data is decoded based on channel output data, the decoding method comprising:

computing bit-wise probabilities of the channel output data by probability computing means;

upon an input of a bit-wise probability of the channel output data, creating an a posteriori probability of the code data in a first APP decoding process performed by first APP decoding means consisting of no more than one decoder in compliance with constraints representing correspondences between RLL modulator input data and channel output data, to output the a posteriori probability of the code data; and upon an input of the a posteriori probability of the code data, creating an a posteriori probability of the information data in a second APP decoding process performed by second APP decoding means in compliance with constraints concerning error-correcting codes, to output the a posteriori probability of the information data.

12. The decoding method according to claim 11, wherein the error-correcting coding is a turbo coding; and
the second APP decoding process is a turbo decoding process corresponding to the turbo coding.

13. The decoding method according to claim 11, wherein the channel has a PR transfer characteristic; and
the constraints representing correspondences between RLL modulator input data and channel output data that are used in the first APP decoding process are constraints that meet both constraints concerning the RLL modulation and constraints concerning the PR transfer characteristic.

14. The decoding method according to claim 11, wherein the first APP decoding process is performed in compliance with trellis diagram information representing the constraints representing correspondences between RLL modulator input data and channel output data, which information is stored in a memory.

15. The decoding method according to claim 11, wherein the error-correcting coding is convolutional coding.

16. The decoding method according to claim 11, wherein logarithmic-likelihood ratios are used as the probability and a posteriori probability, while logarithmic-likelihood ratio values are used as the a priori information and extrinsic information.

17. A recording-medium reproducing apparatus comprising:
reproduction means for, from a recording medium on which channel data is recorded, the channel data resulting from subjecting information data to error-correcting coding to create code data, subjecting the code data to RLL modulation, reproducing the recorded channel data and outputting the reproduced data as channel output data; and
decoding means for obtaining a posteriori probabilities of the information data from the reproduced data by the decoding method according to claim 11, and reconstructing the information data according to the a posterior probabilities of the information data.

18. A decoding method for decoding of information data which has been subjected to an error-correcting coding so as to be formed into code data, the code data being subjected to an RLL modulation so as to be formed into channel input data, the channel input data being to be reproduced over a passage through a channel, where the information data is decoded based on channel output data, the decoding method comprising:
computing bit-wise probabilities of the channel output data by probability computing means;
performing, by first APP decoding means consisting of no more than one decoder, a first APP decoding process for, upon inputs of a bit-wise probability of the channel output data and a priori information concerning code data, creating and outputting an a posteriori probability of the code data in compliance with constraints representing correspondences between RLL modulator input data and channel output data; and
performing, by second APP decoding means, a second APP decoding process for, upon an input of an a posteriori probability of the code data, creating and outputting an a posteriori probability of the information data and a priori information concerning code data in compliance with constraints concerning error-correcting codes,
the said decoding processes being iteratively performed to implement an iterative decoding.

19. The decoding method according to claim 18, wherein the error-correcting coding is a turbo coding; and
the second APP decoding process is a turbo decoding process corresponding to the turbo coding.

20. The decoding method according to claim 18, wherein the channel has a PR transfer characteristic; and
the constraints representing correspondences between RLL modulator input data and channel output data that are used in the first APP decoding process are constraints that meet both constraints concerning the RLL modulation and constraints concerning the PR transfer characteristic.

21. The decoding method according to claim 18, wherein the first APP decoding process is performed in compliance with trellis diagram information representing the constraints representing correspondences between RLL modulator input data and channel output data, which information is stored in a memory.

22. The decoding method according to claim 18, wherein the error-correcting coding is convolutional coding.

23. The decoding method according to claim 18, wherein logarithmic-likelihood ratios are used as the probability and a posteriori probability, while logarithmic-likelihood ratio values are used as the a priori information and extrinsic information.

24. A recording-medium reproducing apparatus comprising:
reproduction means for, from a recording medium on which channel data is recorded, the channel data resulting from subjecting information data to error-correcting coding to create code data, subjecting the code data to RLL modulation, reproducing the recorded channel data and outputting the reproduced data as channel output data; and
decoding means for obtaining a posteriori probabilities of the information data from the reproduced data by the decoding method according to claim 18, and reconstructing the information data according to the a posteriori probabilities of the information data.

25. A decoding method for decoding of data which has been subjected to an RLL modulation so as to be formed into channel input data, the channel input data being to be reproduced over a passage through a channel, where the decoding of data is performed based on channel output data, wherein:
the RLL modulation is expressible by a conversion table listing combinations of preceding output bits, current input bits, succeeding input bits, and bits to be output;
the decoding is performed through an APP decoding process in compliance with constraints concerning the modulation, which constraints are expressed by trellis diagram information in which contents in the conversion table are regarded as trellis code.

26. The decoding method according to claim 25, wherein the channel is equalized so as to satisfy Nyquist's first criterion.

27. The decoding method according to claim 25, wherein the APP decoding process is performed based on trellis diagram information representing the constraints concerning the modulation, which information is stored in a memory.

28. A decoding method for decoding of information data which has been subjected to an error-correcting coding so as to be formed into code data, the code data being subjected sequentially to a pseudo-random interleaving and an RLL modulation so as to be formed into channel input data, the channel input data being to be reproduced over a passage through a channel, where the information data is decoded based on channel output data,
  wherein the RLL modulation is expressible by a conversion table listing combinations of preceding output bits, current input bits, succeeding input bits, and bits to be output, the decoding method comprising:
  computing bit-wise probabilities of the channel output data by probability computing means;
  performing, by first APP decoding means, a first APP decoding process for, upon receiving inputs of bit-wise probabilities of the channel output data and first a priori information concerning the code data, creating and outputting first a posteriori probabilities of the code data in compliance with constraints concerning the modulation, which constraints are expressed by trellis diagram information in which contents in the conversion table are regarded as trellis code;
  performing, by deinterleaving means, a deinterleaving process for subjecting, to deinterleaving of the pseudo-random interleaving, a probability value relating to a first a posteriori probability of the code data outputted from the first APP decoding means by deinterleaving means to thereby create and output second a priori information concerning the code data;
  performing, by second APP decoding means, a second APP decoding process for, upon receiving an input of the second a priori information concerning code data, creating and outputting a posteriori probability of the information data and a second a posteriori probability of the code data in compliance with constraints concerning error-correcting codes;
  performing, by interleaving means, an interleaving process for subjecting, to the pseudo-random interleaving, a probability value relating to the second a posteriori probability of the code data outputted from the second APP decoding means to thereby create and output first a priori information concerning the code data;
  performing, by first computing means, a first computation process for either creating first extrinsic information concerning code data updated by the first APP decoding process based on the probability value before the deinterleaving process and the probability value after the interleaving process and outputting the first extrinsic information to the deinterleaving means as a probability value relating to the first a posteriori probability, or for creating the first extrinsic information based on the probability value after the deinterleaving process and the probability value before the interleaving process and outputting the first extrinsic information to the second APP decoding means as the second a priori information; and
  performing, by second computing means, a second computation process for either creating second extrinsic information concerning code data updated by the second APP decoding process based on the probability value before the interleaving process and the probability value after the deinterleaving process and outputting the second extrinsic information to the interleaving means as a probability value relating to the second a posteriori probability, or for creating second extrinsic information based on the probability value after the interleaving process and the probability value before the deinterleaving process and outputting the second extrinsic information to the first APP decoding means as the first a priori information,
  said processes being iteratively performed to implement an iterative decoding.

29. The decoding method according to claim 28, wherein the error-correcting coding is a turbo coding; and
  the second APP decoding process is a turbo decoding process corresponding to the turbo coding.

30. The decoding method according to claim 28, wherein the channel is equalized so as to satisfy Nyquist's first criterion.

31. The decoding method according to claim 28, wherein the first APP decoding process is performed in compliance with trellis diagram information representing the constraints concerning the modulation, which information is stored in a memory.

32. The decoding method according to claim 28, wherein the error-correcting coding is convolutional coding.

33. The decoding method according to claim 28, wherein logarithmic-likelihood ratios are used as the probability and a posteriori probability, while logarithmic-likelihood ratio values are used as the a priori information and extrinsic information.

34. A recording-medium reproducing apparatus comprising:
  reproduction means for, from a recording medium on which channel data is recorded, the channel data resulting from subjecting information data to error-correcting coding to create code data, subjecting the code data to pseudo-random interleaving and RLL modulation, reproducing the recorded channel data and outputting the reproduced data as channel output data; and
  decoding means for obtaining a posteriori probabilities of the information data from the reproduced data by the decoding method according to claim 28, and reconstructing the information data according to the a posteriori probabilities of the information data.

35. A decoding method for decoding of information data which has been subjected to an error-correcting coding so as to be formed into code data, the code data being subjected to an RLL modulation so as to be formed into channel input data, the channel input data being to be reproduced over a passage through a channel, where the information data is decoded based on channel output data, wherein the RLL modulation is expressible by a conversion table listing combinations of preceding output bits, current input bits, succeeding input bits, and bits to be output, the decoding method comprising:
  computing bit-wise probabilities of the channel output data by probability computing means;
  upon an input of a bit-wise probability of the channel output data, creating an a posteriori probability of the code data in a first APP decoding process performed by first APP decoding means in compliance with constraints concerning the modulation, to output the a posteriori probability of the code data, said constraints being expressed by trellis diagram information in which contents in the conversion table are regarded as trellis code; and
  upon an input of the a posteriori probability of the code data, creating an a posteriori probability of the information data in a second APP decoding process performed by second APP decoding means in compliance with constraints concerning error-correcting codes, to output the a posteriori probability of the information data.

36. The decoding method according to claim 35, wherein the error-correcting coding is a turbo coding; and
  the second APP decoding process is a turbo decoding process corresponding to the turbo coding.

37. The decoding method according to claim 35, wherein the channel is equalized so as to satisfy Nyquist's first criterion.

38. The decoding method according to claim 35, wherein the first APP decoding process is performed in compliance with trellis diagram information representing the constraints concerning the modulation, which information is stored in a memory.

39. The decoding method according to claim 35, wherein the error-correcting coding is convolutional coding.

40. The decoding method according to claim 35, wherein logarithmic-likelihood ratios are used as the probability and a posteriori probability, while logarithmic-likelihood ratio values are used as the a priori information and extrinsic information.

41. A recording-medium reproducing apparatus comprising:
reproduction means for, from a recording medium on which channel data is recorded, the channel data resulting from subjecting information data to error-correcting coding to create code data, subjecting the code data to RLL modulation, reproducing the recorded channel data and outputting the reproduced data as channel output data; and
decoding means for obtaining a posteriori probabilities of the information data from the reproduced data by the decoding method according to claim 35, and reconstructing the information data according to the a posteriori probabilities of the information data.

42. A decoding method for decoding of information data which has been subjected to an error-correcting coding so as to be formed into code data, the code data being subjected to an RLL modulation so as to be formed into channel input data, the channel input data being to be reproduced over a passage through a channel, where the information data is decoded based on channel output data,
wherein the RLL modulation is expressible by a conversion table listing combinations of preceding output bits, current input bits, succeeding input bits, and bits to be output, the decoding method comprising:
computing bit-wise probabilities of the channel output data by probability computing means;
performing, by first APP decoding means, a first APP decoding process for, upon inputs of a bit-wise probability of the channel output data and a priori information concerning code data, creating and outputting an a posteriori probability of the code data in compliance with constraints concerning the modulation, which constraints are expressed by trellis diagram information in which contents in the conversion table are regarded as trellis code; and
performing, by second APP decoding means, a second APP decoding process for, upon an input of an a posteriori probability of the code data, creating and outputting an a posteriori probability of the information data and a priori information concerning code data in compliance with constraints concerning error-correcting codes,
the said decoding processes being iteratively performed to implement an iterative decoding.

43. The decoding method according to claim 42, wherein the error-correcting coding is a turbo coding; and
the second APP decoding process is a turbo decoding process corresponding to the turbo coding.

44. The decoding method according to claim 42, wherein the channel is equalized so as to satisfy Nyquist's first criterion.

45. The decoding method according to claim 42, wherein the first APP decoding process is performed in compliance with trellis diagram information representing the constraints concerning the modulation, which information is stored in a memory.

46. The decoding method according to claim 42, wherein the error-correcting coding is convolutional coding.

47. The decoding method according to claim 42, wherein logarithmic-likelihood ratios are used as the probability and a posteriori probability, while logarithmic-likelihood ratio values are used as the a priori information and extrinsic information.

48. A recording-medium reproducing apparatus comprising:
reproduction means for, from a recording medium on which channel data is recorded, the channel data resulting from subjecting information data to error-correcting coding to create code data, subjecting the code data to RLL modulation, reproducing the recorded channel data and outputting the reproduced data as channel output data; and
decoding means for obtaining a posteriori probabilities of the information data from the reproduced data by the decoding method according to claim 42, and reconstructing the information data according to the a posteriori probabilities of the information data.

* * * * *